United States Patent
Yagyu et al.

(10) Patent No.: US 9,531,186 B2
(45) Date of Patent: Dec. 27, 2016

(54) CURRENT DETECTION CIRCUIT AND SEMICONDUCTOR INTEGRATED CIRCUIT DEVICE

(71) Applicant: DENSO CORPORATION, Kariya, Aichi-pref. (JP)

(72) Inventors: Keisuke Yagyu, Kariya (JP); Kazuhiro Umetani, Kariya (JP)

(73) Assignee: DENSO CORPORATION, Kariya (JP)

( * ) Notice: Subject to any disclaimer, the term of this patent is extended or adjusted under 35 U.S.C. 154(b) by 429 days.

(21) Appl. No.: 14/362,623

(22) PCT Filed: Dec. 11, 2012

(86) PCT No.: PCT/JP2012/007889
§ 371 (c)(1),
(2) Date: Jun. 4, 2014

(87) PCT Pub. No.: WO2013/094148
PCT Pub. Date: Jun. 27, 2013

(65) Prior Publication Data
US 2014/0334051 A1   Nov. 13, 2014

(30) Foreign Application Priority Data

Dec. 19, 2011 (JP) .................. 2011-277164

(51) Int. Cl.
*H02H 9/02* (2006.01)
*G01R 19/00* (2006.01)
*H02M 1/00* (2006.01)

(52) U.S. Cl.
CPC ............ *H02H 9/02* (2013.01); *G01R 19/0092* (2013.01); *H02M 2001/0009* (2013.01); *H03K 2217/0027* (2013.01)

(58) Field of Classification Search
USPC ....................................................... 361/93.1
See application file for complete search history.

(56) References Cited

U.S. PATENT DOCUMENTS

| 5,652,540 | A | * | 7/1997 | Eilley | ................ | G01R 19/0092 |
| | | | | | | 257/E29.2 |
| 2002/0063573 | A1 | * | 5/2002 | Genova | ............ | G01R 19/16519 |
| | | | | | | 324/764.01 |

(Continued)

FOREIGN PATENT DOCUMENTS

| JP | 11-083911 A | 3/1999 |
| JP | 2000-180478 A | 6/2000 |

(Continued)

OTHER PUBLICATIONS

International Search Report of the International Searching Authority mailed Mar. 12, 2013 for the corresponding international application No. PCT/JP2012/007889 (with English translation).

(Continued)

*Primary Examiner* — Ronald W Leja
(74) *Attorney, Agent, or Firm* — Posz Law Group, PLC

(57) ABSTRACT

In a current detection circuit, a first circuit is connected between a first terminal and a second terminal, and a second circuit is connected between a third terminal and a fourth terminal. The second terminal and the fourth terminal are commonly connected. When a first current flows between the first and second terminals, voltage drop occurs in the first circuit. A current control circuit controls the first current to make an application voltage between the first and second terminals substantially same as an application voltage between the third and fourth terminals. When the first circuit has voltage drop same as the second circuit, the first current has the amount proportional to the second current. A detection circuit detects a current flowing between the first terminal and the third terminal by detecting the first current controlled by the current control circuit or the second current.

18 Claims, 21 Drawing Sheets

(56) References Cited

U.S. PATENT DOCUMENTS

| | | | |
|---|---|---|---|
| 2007/0171590 A1 | 7/2007 | Nagata et al. | |
| 2007/0263334 A1 | 11/2007 | Nishida | |
| 2011/0068762 A1 | 3/2011 | Nishida | |
| 2011/0101943 A1 | 5/2011 | Kato | |
| 2012/0086424 A1* | 4/2012 | Uemura | G01R 19/0092 323/304 |
| 2012/0200960 A1* | 8/2012 | Mueller | G01R 15/146 361/20 |
| 2013/0181723 A1* | 7/2013 | Mauder | G01R 19/0092 324/601 |
| 2013/0278328 A1* | 10/2013 | Denison | H01L 24/97 327/543 |
| 2014/0177112 A1* | 6/2014 | Park | H02M 1/44 361/56 |
| 2014/0226380 A1* | 8/2014 | Kawashima | H02M 7/539 363/97 |
| 2014/0334051 A1* | 11/2014 | Yagyu | H02H 9/02 361/93.1 |
| 2015/0042373 A1* | 2/2015 | Nakamura | G01R 31/041 324/762.03 |
| 2015/0346245 A1* | 12/2015 | Kiep | H02M 1/08 323/271 |
| 2016/0065087 A1* | 3/2016 | Nagaoka | G01R 19/0092 324/139 |
| 2016/0087626 A1* | 3/2016 | Kaeriyama | G01R 19/0092 327/109 |

FOREIGN PATENT DOCUMENTS

| | | | | |
|---|---|---|---|---|
| JP | 2000-235424 A | | 8/2000 | |
| JP | 2004-140423 A | | 5/2004 | |
| JP | WO 2015064219 A1 * | | 5/2015 | H02M 1/10 |

OTHER PUBLICATIONS

Written Opinion of the International Searching Authority mailed Mar. 12, 2013 for the corresponding international application No. PCT/JP2012/007889 (with English translation).

* cited by examiner (a)

(b)

CURRENT DETECTION CIRCUIT AND SEMICONDUCTOR INTEGRATED CIRCUIT DEVICE

CROSS REFERENCE TO RELATED APPLICATIONS

The present application is a U.S. national stage application of PCT/JP2012/007889 filed on Dec. 11, 2012 and is based on Japanese Patent Application No. 2011-277164 filed on Dec. 19, 2011, the contents of which are incorporated herein by reference.

TECHNICAL FIELD

The present disclosure relates to a current detection circuit and a semiconductor integrated circuit device.

BACKGROUND ART

For example, in a case where a power converter is particularly used to drive a motor of an electric vehicle, the power converter needs to have high responsiveness so as to make its output follow at high speed according to change in driving condition. In such a power converter, it has been known, as effective means, to sense a current flowing in a switching element, in addition to input and output voltages, and to perform control according to the sensed current. However, sensing a conduction current of the switching element is likely to cause power loss according to the sensed current, resulting in deterioration of efficiency. Therefore, it is difficult to put such means into practice.

Conventionally, as shown in FIG. 19, it has been proposed a method of connecting a current sensing resistor Rs in series to an emitter (source) terminal of a switching element Q100 and calculating a current flowing in the switching element Q100. In this method, however, when a large current is detected, power loss at the current sensing resistor Rs100 increases, resulting in decrease in power conversion efficiency of the power conversion circuit.

In order to reduce such power loss, for example, a technique disclosed in patent literature 1 is provided. In the technique of the patent literature 1, as shown in FIG. 20, a source terminal N100 of a main switching element Q93 and a source terminal N200 of a current detection switching element Q94 are feedback-controlled to have substantially the same potential using a comparator CMP401 and a switching element Q95.

Since the source terminal N100 and the source terminal N200 are controlled to have the same potential, each of the drain-to-source voltage and the gate-to-source voltage is substantially the same voltage between the switching element Q94 and the switching element Q93. Therefore, when transistors having element characteristics are used as the switching element Q94 and the switching element Q93, a conduction current of the switching element Q93 can be estimated by sensing a conduction current of the switching element Q94.

In this case, as the switching element Q94, an element having the same conductivity type as the switching element Q93, and being a transistor with a much smaller chip area is used. Therefore, a current ratio of the switching element Q94 and the switching element Q93 can be a sufficiently large constant value K.

By this reason, a current value $I_1$ flowing in the switching element Q93 and a load 102 can be obtained as shown in the following expression (1) by detecting a voltage Vs at both ends of a shunt resistor $R_{r2}$.

[Ex. 1]

$$I_1 = KI_2 = K\frac{V_s}{R_{r2}} \qquad (1)$$

$I_1$: Current flowing in Q93
$I_2$: Current flowing in Q94
K: Current ratio
$R_{r2}$: Shunt resistance value
$V_s$: Sensed voltage value In this method, when the current $I_2$ is measured, power loss occurs because the current $I_2$ flows through the resistor $R_{r2}$. When the constant K is set to a sufficiently large constant value, the current $I_2$ can be sufficiently reduced and the power loss can be reduced.

However, if the above-described technical idea is employed, the following two issues exit. Firstly, the comparator CMP401 compares the source potential of the switching element Q93 and the source potential of the switching element Q94. Because the main switching element Q93 has a relatively large current capacity, a current gradient dI1/dt increases during switching.

If the current having this large current gradient is applied to an inductance being parasitic on a wiring, high induced voltage occurs. Therefore, when the switching element Q93 and the switching element Q94 are turned on and off, the voltage at the input terminal of the comparator CMP401 connected to the switching element Q93 largely varies. Since the comparator CMP401 is a small-signal analog component, if a voltage having fluctuation greater than a power supply voltage is applied to the input terminal, the element is likely to be deteriorated.

Therefore, as shown in FIG. 21, it is considered to use both the power sources relative to the input terminal voltage, as the power source of the comparator CMP401. In this structure, even if the terminal voltage of the comparator CMP401 largely fluctuates due to parasitic inductance generated at the source of the switching element Q93, the power source voltage fluctuates following to this voltage fluctuation. Therefore, it is less likely that the input terminal of the comparator CMP401 connected to the switching element Q93 will be deteriorated.

However, since the inversion input terminal of the comparator CMP401 is connected to the source of the switching element Q94, the potential of the inversion input terminal does not follow the above-mentioned voltage fluctuation. Therefore, there is a possibility that the inversion input terminal connected to the switching element Q94 deteriorates.

This issue arises because high-impedance input terminals of the comparator CMP401 are directly connected to the sources of the switching elements Q94 and Q93. Conventionally, when large voltage fluctuation occurs at the source of the switching element Q93, an overvoltage is necessarily applied between both input terminals of the comparator CMP401, resulting in the deterioration of the element.

Secondly, the following issue arises. As shown in FIG. 22, when magnetic induction coupling occurs between two wirings, the input terminal voltage of the comparator CMP401 increases, and the element is likely to be deteriorated. Since the input terminal of the comparator CMP401 is connected to the source of the switching element Q93, the magnetic induction coupling tends to increase, as compared to the other wiring.

When the switching element Q93 is switched, a large current gradient $di_1/dt$ occurs. When the magnetic induction coupling between the wirings increases, an electric current is applied via a path shown by a solid arrow in FIG. 23 including both the input terminals of the comparator CMP401 so as to cancel the current change. However, since the input terminals of the comparator CMP401 are the high-impedance terminals, the voltage between the terminals increases, and the element of the comparator CMP401 is likely to be deteriorated.

The cause of this issue is because there is a path leading to the ground through the both input terminals of the comparator CMP401, differently from a path leading to the ground from the switching element Q93 via a load 102. In a normal operation, the input impedance of the comparator CMP401 is high, and thus the current is less likely to flow.

Since this type of the comparator CMP401 is an element for a small-signal analog circuit, the comparator CMP401 is easily damaged when the excessive voltage is applied to the input terminals. Therefore, there is a possibility that the electric current is likely to instantly flow to the input terminals of the comparator CMP201 according to the electric current generated at the time of switching of the switching element Q93. Further, there is a possibility that the element of the comparator CMP401 deteriorates.

In the technique of the patent literature 1, the elements of the current detection circuit adjacent to the main switching element Q93 is likely to be deteriorated according to the induced voltage or the induced current caused by the switching operation of the main switching element Q93. The improvement of reliability is desired to be applied to good products.

PRIOR ART LITERATURE

Patent Literature

Patent Literature 1: JP-A-2000-235424
Patent Literature 2: JP-A-2009-291057

SUMMARY OF INVENTION

The present disclosure is made in view of the foregoing matters, and it is an object of the present disclosure to provide a current detection circuit that can detect a current while protecting from overvoltage or overcurrent, which is likely to be generated according to induced voltage or induced current, and to provide a semiconductor integrated circuit device integrating the current detection circuit.

According to a first aspect of the present disclosure, in a current detection circuit, a first circuit is connected between a first terminal and a second terminal, and a second circuit is connected between a third terminal and a fourth terminal. The second terminal and the fourth terminal are commonly connected to each other. When a first current flows between the first terminal and the second terminal, a voltage drop occurs in the first circuit. A current control circuit controls the first current of the first circuit to make an application voltage between the first terminal and the second terminal of the first circuit and an application voltage between the third terminal and the fourth terminal of the second circuit substantially the same voltage according to the amount of the second current of the second circuit.

When the voltage drop of the first circuit is same as voltage drop of the second circuit, the current flowing between the first terminal and the second terminal has the amount proportional to the second current of the second circuit. Therefore, a detection circuit can detects (estimates) a current flowing between the first terminal and the third terminal by detecting the first current of the first circuit controlled by the current control circuit or the second current of the second circuit. Since the first circuit and the second circuit can be made by relatively low-impedance circuits, the current can be detected while protecting from overvoltage or overcurrent according to induced voltage or induced current.

According to a second aspect of the present disclosure, the current detection circuit includes a first current conducting element and a second current conducting element. The first current conducting element conducts a current through a terminal. A current is conducted to the second current conducting element for current detection according to the current flowing in the first current conducting element. Therefore, the current of the first current conducting element can be estimated by a detected current of the second current conducting element. As such, for example, when the first current conducting element is provided as an element that flows a large current and the second current conducting element is provided as an element that flows a small current, the current can be detected while reducing loss caused by detection of the large current and protecting from overvoltage or overcurrent according to induced voltage or induced current.

According to a third aspect of the present disclosure, the first current conducting element and the second current conducting element have an opening and closing function of opening and closing a flowing path of the conduction current of the terminal through a first main electrode according to an application signal applied to a control electrode. The control electrode of the first current conducting element and the control electrode of the second current conducting element are commonly connected to each other, and the first main electrode of the first current conducting element and the first main electrode of the second current conducting element are commonly connected to each other. Therefore, when a second main electrode of the first current conducting element and a second main electrode of the second current conducting element have the same potential, currents proportional to each other flow in the first current conducting element and the second current conducting element. With this, in a semiconductor switch or the like having the control terminal, the current can be detected while reducing loss caused by the detection of the large current and protecting from overvoltage or overcurrent according to inducted voltage or induced current.

According to a fourth aspect of the present disclosure, the control circuit, which controls the first current of the first circuit, detects a current or a voltage of the second circuit. The control circuit controls the application voltage between the first terminal and the second terminal of the first circuit to be substantially the same voltage as the application voltage between the third terminal and the fourth terminal of the second circuit by drawing or supplying the sum of the currents flowing in the first circuit and the second circuit from or to the second terminal, when the first circuit is applied with the voltage equal to the voltage drop of the second circuit. The current to be drawn or to be supplied may have a current ratio with a fixed ratio relative to the detected current of the second circuit, and thus the above-described control can be easily realized.

According to a fifth aspect of the present disclosure, each of the first current conducting element and the second current conducting element includes a diode, and one of anodes and cathodes may be connected to each other. For example, when this diode is an anti-parallel diode of a semiconductor switching element, positive and negative currents flowing in the semiconductor switch can be detected.

According to a sixth aspect of the present disclosure, the first circuit and the second circuit may both use resistors, and the second current of the second circuit may be detected according to the voltage generated in the resistor of the second circuit. As compared with a non-linear element, a linear element, such as the resistor, generally has higher detection accuracy of current corresponding to the voltage drop. Therefore, the detection accuracy of the current can be further improved.

According to a seventh aspect of the present disclosure, the first circuit and the second circuit may both use diodes or diode-connected transistors. The second current of the second circuit may be detected according to the voltage drop of the diode or the diode-connected transistor. In such a case, even if the conduction current of the second circuit largely fluctuated, fluctuation of the voltage drop can be reduced small. Therefore, even if the power supply voltage of the current detection circuit increases, a dynamic range of the current detection can be taken widely.

According to an eighth aspect of the present disclosure, a current control function controls an output current, which is provided by mirroring the conduction current of the second circuit as an input current with a fixed ratio, as an output current to be conducted to the first circuit. Therefore, the voltage can be controlled using the current control function. For example, it is convenient in a structure of being formed on the same semiconductor substrate in a semiconductor integrated circuit.

According to a ninth aspect of the present disclosure, the current of the first circuit can be made small. Therefore, the total amount of the current conducted to the current detection circuit can be reduced. Accordingly, it is convenient to reduce a structural area of semiconductor and to reduce power consumption.

According to a tenth aspect of the present disclosure, a first current mirror circuit obtains an output current that is provided by mirroring the conduction current of the second circuit as the input current. A second current mirror circuit controls an output current that is provided by mirroring the output current of the first current mirror circuit as an output current to be conducted to the first circuit. By this, the application voltage between the first terminal and the second terminal of the first circuit can be made substantially the same as the application voltage between the third terminal and the fourth terminal of the second circuit.

In the tenth aspect, the function of the current detection function can be realized mainly by combination of simple transistor circuits by making the current control function according to the eighth aspect described above separate into the first current mirror circuit and the second current mirror circuit. Therefore, the structure can be made easily even on the semiconductor integrated circuit on which circuits other than the transistors are difficult to be made.

According to an eleventh aspect of the present disclosure, in a case where the output current of the first current mirror circuit is supplied from the second current conducting element, the output current of the first current mirror circuit is set larger than the input current. By this, the total amount of current flowing in the current detection circuit can be reduced, and thus it is convenient to reduce the semiconductor area and to reduce power consumption.

According to a twelfth aspect of the present disclosure, in a case where the output current of the first current mirror circuit is supplied from the second current conducting element, the output current of the second current mirror circuit is set smaller than the input current. By this, the total amount of current flowing in the current detection circuit can be reduced, and thus it is convenient to reduce the semiconductor area and to reduce power consumption.

According to a thirteenth aspect of the present disclosure, a third current mirror circuit uses, as an input circuit, one of the conduction current of the second circuit, a conduction current on a current path in which a current proportional to the conduction current of the second circuit flows, and the output current of the first circuit controlled by the current control circuit, and obtains an output current by mirroring this input current. The detection circuit detects the current according to detection of the output current of the third current mirror circuit. Therefore, the current can be detected using the third current mirror circuit, and thus it is convenient in a structure of being made on the same semiconductor substrate in a semiconductor integrated circuit, for example.

According to a fourteenth aspect of the present disclosure, the output current of the third current mirror circuit is set smaller than the input current. By this, the total amount of current flowing in the current detection circuit can be reduced, and thus it is convenient to reduce the semiconductor area and to reduce power consumption.

According to a fifteenth aspect of the present disclosure, since a mirror ratio of the output current to the input current of the third current mirror circuit can be switched by a switching element, a range of current detection can be expanded.

According to a sixteenth aspect of the present disclosure, a current restriction function that detects a circuit current within the detection circuit and restricts the second current when the circuit current exceeds a predetermined current value is provided. In this case, since it is less likely that an excessive current will flow in the current detection circuit, breakdown due to conduction of the excessive current can be favorably avoided.

According to a seventeenth aspect of the present disclosure, the first circuit, the second circuit and the current control circuit are integrated on the same semiconductor substrate by combination of semiconductor elements. Therefore, the substantially whole structure can be made integrally by a semiconductor integrated circuit.

According to an eighteenth aspect of the present disclosure, a drive control circuit of the first current conducting element and the second current conducting element is also integrated on the same semiconductor substrate, and thus can be integrated into a semiconductor integrated circuit device.

BRIEF DESCRIPTION OF DRAWINGS

The above and other objects, features and advantages of the present disclosure will become more apparent from the following detailed description made with reference to the accompanying drawings, in which.

EMBODIMENTS FOR CARRYING OUT INVENTION

First Embodiment

Figure 1:
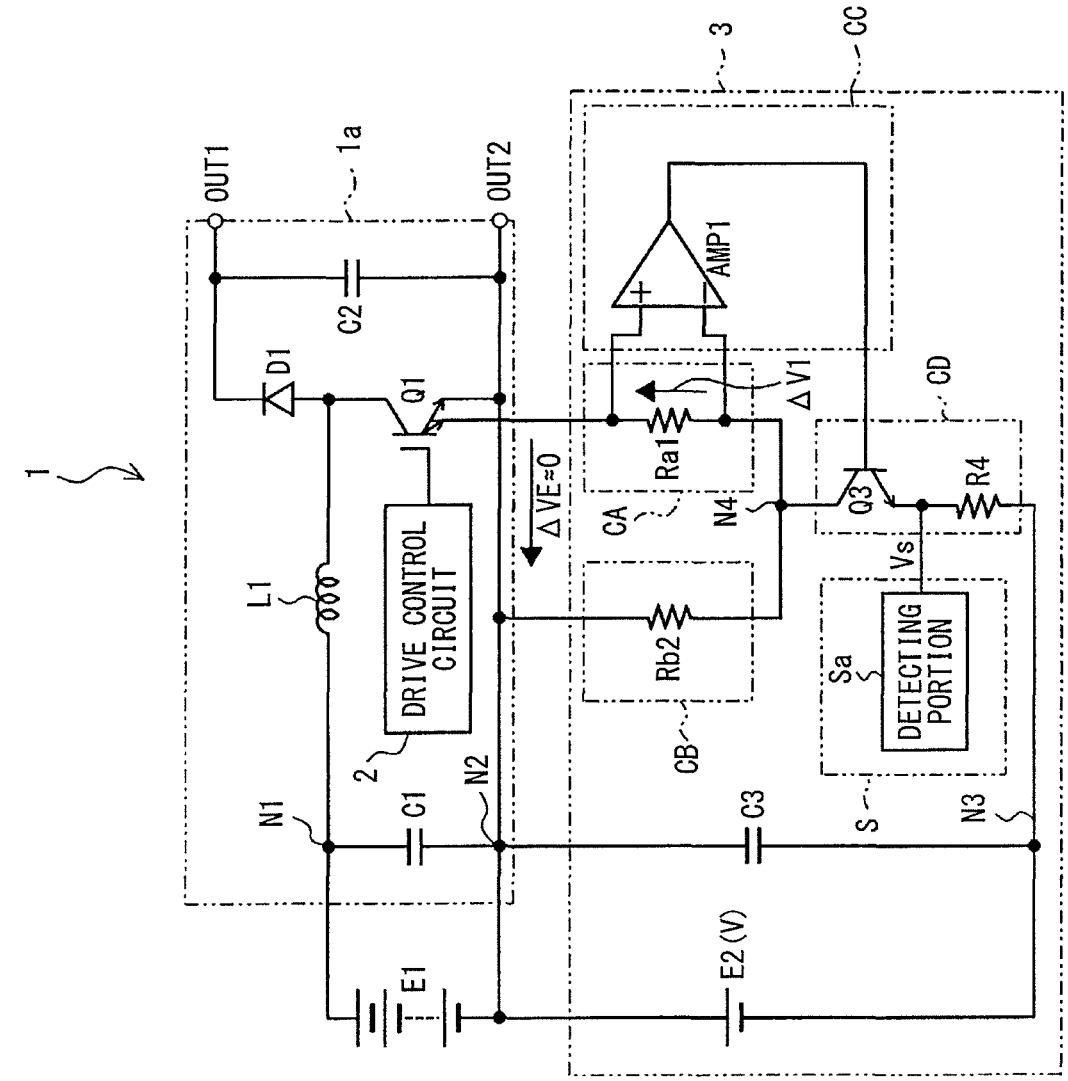
FIG. 1 is a diagram illustrating a circuit structure of a power conversion circuit according to a first embodiment of the present disclosure.

Hereinafter, a first embodiment of the present disclosure will be described with reference to FIGS. 1 to 3. FIG. 1 is a diagram illustrating an electric structure of a power conversion circuit.

A power converting portion 1a of a power conversion circuit 1 is constructed of a non-insulated- and boost chopper-type booster circuit. The power converting portion 1a of the power conversion circuit 1 mainly includes a main transistor Q1 (corresponding to a first current conducting element and a second current conducting element). The main transistor Q1 is made of a multi-emitter power semiconductor switching element, such as an IGBT (Insulated Gate Bipolar Transistor). This main transistor Q1 is a multi-emitter-type IGBT, and in which, in general, one emitter (corresponding to a second main electrode of the first current conducting element) conducts a large current, and the other emitter (corresponding to a second main electrode of the second current conducting element) conducts a current with the amount of a few hundredth to a few thousandth of the large current.

A capacitor C1 is connected between a main power supply line N1 and a main power supply line N2, which are applied with a DC voltage of a DC voltage generation circuit E1. The DC voltage generation circuit E1 outputs the DC voltage between the main power supply line N1 and the main power supply line N2.

An inductor L1 is connected in series between the main power supply line N1 and a common collector of the main transistor Q1. A diode D1 is connected in a forward direction between the collector of the main transistor Q1 and an output terminal OUT1. A capacitor C2 is connected between the output terminal OUT1 and an output terminal OUT2 to which the main power supply line N2 is connected.

A collector (corresponding to a first main electrode)-to-emitter of the main transistor Q1 is connected between a common node of the inductor L1 and the anode of the diode D1 and the main power supply line N2. A drive control circuit 2 performs DC/DC conversion of the DC voltage of the DC voltage generation circuit E1, according to application of on and off control signals, such as PWM signal, to a gate (corresponding to a control electrode) of the main transistor Q1, thereby to output the voltage between the output terminal OUT1 and the output terminal OUT2.

Under such a basic structure, the multi-emitter-type main transistor Q1 connects the one emitter to the main power supply line N2 so as to operate for conducting high power, and uses the other emitter for current detection. Therefore, the main transistor Q1 is configured to connect the other emitter to a current detection circuit 3, which is illustrated at a lower section in FIG. 1. The current detection circuit 3 operates according to a DC voltage of a DC voltage generation circuit E2, which is applied between the main power supply line N2 and a sub power supply line N3.

A capacitor C3 is connected between the main power supply line N2 and the sub power supply line N3. The other emitter of the main transistor Q1 is connected to a resistor Ra1 (corresponding to a second circuit) for current detection. The one emitter of the main transistor Q1 is connected to a resistor Rb2 (corresponding to a first circuit).

These resistors Ra1 and Rb2 are commonly connected at a common connection node (voltage reference node) N4, and both ends of the resistor Ra1 are inputted to an instrumentation amplifier AMP1. The instrumentation amplifier AMP1 is operated by electric power supplied by the DC voltage generation circuit E2. Each of the resistor Ra1 and the resistor Ra2 is a resistor for current detection and has a resistance value of an approximately several tens ohms. An impedance can be reduced, when the current detection circuit 3 is viewed from the one emitter and the other emitter of the main transistor Q1.

The instrumental amplifier AMP1 amplifies a voltage between both ends of the resistor Ra1 to predetermined times, and conducts electricity to a resistor R4 (for example, approximately several to several tens ohms) through a transistor Q3. Therefore, a proportional current that is proportional to a voltage drop ΔV1 of the resistor Ra1 flows in the resistor R4. In this case, an amplification factor of the instrumental amplifier AMP1 is set beforehand to a factor so that the sum of the currents flowing in the resistor Ra1 and the resistor Rb2, when the resistor Ra1 and the resistor Rb2 are applied with the voltage ΔV1, flows in the resistor R4.

Therefore, the conduction currents of the resistor Ra1 and the resistor Rb2 can be controlled according to the output current of the instrumental amplifier AMP1. The instrumental amplifier AMP1 supplies the current corresponding to the sum of the current flowing in the resistor Ra1 and the resistor Rb2 to the resistor R4 so that the voltage drop at the resistor Ra1 and the voltage drop at the resistor Rb2 are equal to the voltage drop ΔV1. By this configuration, the voltage drop at the resistor Ra1 and the voltage drop at the resistor Rb2 are equal to each other. Therefore, it is controlled so that the terminal voltage at the resistor Ra1 and the terminal voltage at the resistor Rb2 are at the same voltage as the result. In this case, in the main transistor Q1, the one emitter and the other emitter have substantially the same potential (ΔVE≈0), and the current at the one emitter and the current at the other emitter have a proportional relationship.

The current at the resistor Ra1 and the current at the resistor Rb2 are proportional to each other with a proportionality factor according to a resistance ratio. Therefore, the current at the other emitter can be detected by detecting the terminal voltage Vs of the resistor R4 in which the current with the sum of the current at the resistor Ra1 and the current at the resistor Rb2 flows. Also, the current at the one emitter, which has the proportional relationship with the current at the other emitter, can be estimated. Further, the current conducted to the output terminal of the power converting portion 1a can be estimated.

<Explanation of Operation of Electric Block Circuit Structure>

Hereinafter, the operation principle of the circuit shown in FIG. 1 will be explained with reference to FIG. 2. The feature of the present embodiment is that the voltage between the collector and the one emitter of the main transistor Q1 and the voltage between the collector and the other emitter of the main transistor Q1 are made substantially the same voltage by controlling the one emitter and the other emitter of the main transistor Q1 to be substantially the same potential (that is, potential difference ΔVE≈0), and the current of the one emitter of the main transistor Q1 and the current of the other emitter of the main transistor Q1 have a proportional relationship.

Since the multi-emitter-type IGBT is used for the main transistor Q1, a current detecting cell and a main circuit cell have similar physical properties to each other, and thus have substantially similar I-V characteristics to each other. Therefore, when the voltage drop generated between the collector and the one emitter of the main transistor Q1 and the voltage drop generated between the collector and the other emitter of the main transistor Q1 are substantially the same, the current of the one emitter and the current of the other emitter can have substantially the proportional relationship.

For the convenience of explanation, the description will be made by dividing the multi-emitter-type main transistor Q1 into a transistor Q1a for conducting large power and a transistor Qs for detecting a current, as shown in the circuit block of FIG. 2. In FIG. 2, among circuit components of the power converting portion 1a, illustrations of components other than the main transistor Q1 are omitted.

Figure 2:
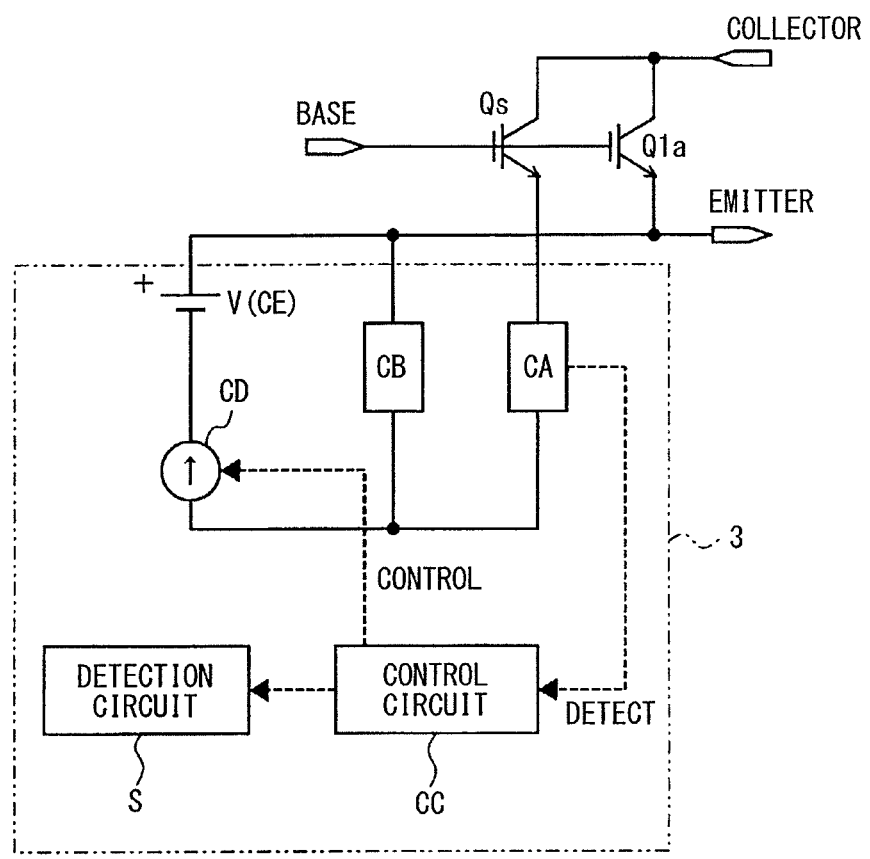
FIG. 2 is a diagram illustrating an electric structure for explaining a block structure of a main part of the power conversion circuit shown in FIG. 1.

As shown in FIG. 2, the current detection circuit 3 can be substituted by a block including a circuit (two-terminal circuit, second circuit) CA, a circuit (two-terminal circuit, first circuit) CB, a control circuit (current control circuit) CC, a control input-type current source CD, a DC voltage generation circuit CE, and a detection circuit S. When the circuit CA and the circuit CB are applied with the same voltage, electric currents proportional to each other flow in the circuit CA and the circuit CB.

The circuit CA draws a sensing current by the current detecting transistor Qs. The control circuit CC detects a conduction current of the circuit CA, and controls an output current of the control input-type current source CD according to the current detected. The control input-type current source CD supplies a current, which corresponds to the current assumed when the voltage same as the voltage drop of the circuit CA is applied to the circuit CA and the circuit CB according to the control of the control circuit CC, to each of the circuit CA and the circuit CB.

In the case of the circuit block diagram of FIG. 2, an output current of the power source CD is the sum of the currents that flows when the voltage drop generated at the circuit CA is generated at each of the circuit CA and the circuit CB. Therefore, the control circuit CC performs control so that the terminal voltage of the circuit CA and the terminal voltage of the circuit CB are the same with each other by the current source CD.

Figure 3:
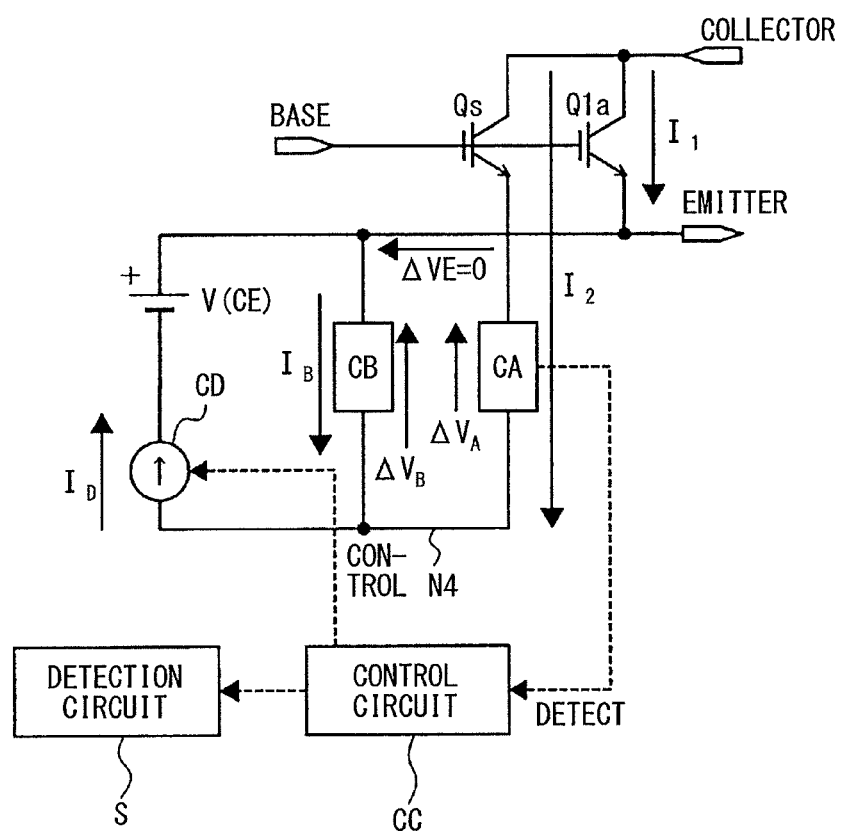
FIG. 3 is a diagram illustrating an electric structure for explaining an operation of the power conversion circuit shown in FIG. 1.

As shown in FIG. 3, the control circuit CC controls the potential difference ΔVE between the emitter of the large power conducting transistor Q1a and the emitter of the current detecting transistor Qs to be substantially zero, using the circuit CA, the circuit CB and the current source CD. In this case, the control circuit CC detects the voltage drop ΔVA generated in the circuit CA, and controls the output current of the control input-type current source CD so that the voltage drop ΔVB generated in the circuit CB is substantially equal to the voltage drop ΔVA.

A connection node of the circuit CA and the circuit CB is the same as the reference potential node N4. Therefore, when the voltage drop ΔVA of the circuit CA and the voltage drop ΔVB of the circuit CB are the same with each other, the emitter potential of the large power conducting transistor Q1a and the emitter potential of the current detecting transistor Qs are substantially equal to each other, and thus the potential difference ΔVE between them is substantially zero.

The emitter current of the large power conducting transistor Q1a is referred to as $I_1$, and the emitter current of the current detecting transistor Qs is referred to as $I_2$. The current $I_1$ and the current $I_2$ have a proportional relationship, and is expressed as follows:

$$I_1 = K \cdot I_2 \quad (2)$$

In the circuit of FIG. 3, a current $I_D$ flowing in the control input-type current source CD is calculated as follows based on Kirchhoff's law:

$$I_D = I_2 + I_B \quad (3)$$

Since ΔVA≈ΔVB and ΔVE≈0 are realized by the control of the control circuit CC, the current $I_2$ flowing in the circuit CA and the current $I_B$ flowing in the circuit CB have the proportional relationship relative to each other, and have the following relationships (4) and (5):

$$I_B = J \cdot I_2 \quad (4)$$

$$I_D = \{(1+J)/K\} \cdot I_1 \quad (5)$$

Therefore, the current $I_1$ can be calculated from the current $I_D$. Based on this principle, the detection circuit S can detect (estimate) the current $I_1$ according to the current $I_D$ of the control input-type current source CD. It is to be noted that the proportionality factors K, J are positive real numbers, respectively.

Summary of Features of Present Embodiment

According to the present embodiment, the current detection circuit 3 detects the voltage between both the ends of the resistor Ra1 using the instrumental amplifier AMP1, and makes the terminal voltage of the resistor Ra1 and the terminal voltage of the resistor Rb2 substantially the same by supplying the electric current, which is the sum of the currents flowing in the resistor Ra1 and the Rb2 when the resistor Ra1 and the resistor Rb2 are both applied with the detected voltage, to the resistor R4. Since the detecting portion Sa (detection circuit S) detects a sensing signal voltage Vs, which is the terminal voltage of the resistor R4, the current of the other emitter can be detected. The current conducted to the output terminal of the power converting portion 1a from the one emitter, which has the proportional relationship with the current of the other emitter, can be estimated.

When the power converting portion 1a converts and outputs the input DC voltage, the inductor L1 accumulates energy of the input DC voltage is accumulated in when the main transistor Q1 is turned on. This energy is transmitted to the output terminals OUT1-OUT2 from the inductor L1 through the diode D1 when the main transistor Q1 is turned off.

When the main transistor Q1 is turned on, the current partly flows in the resistor Ra1 and the resistor Rb2. However, the amount of this current is only the amount of the current supplied from the other emitter. A main path of the current is made from the main power supply line N1-N2 to the output terminal OUT1-OUT2 of the power converting portion 1a. Therefore, only a small amount of current flows in the current detection circuit 3 (the resistor Ra1 and the resistor Rb2), as compared with the amount of the current flowing in the power converting portion 1a. In this case, the current flowing in the current detection circuit 3 can be adjusted to a few hundredths to a few thousandths of the current flowing in the power converting portion 1a.

In this case, the current flowing from the other emitter of the main transistor Q1 to the current detection circuit 3 returns to the main power supply line N2 via the resistor Ra1 or the transistor Q3, the resistor R4, and the DC voltage generation circuit E2. When such a circuit is employed, an impedance of each of the resistor Ra1 and the resistor Rb2 can be set to a lower level by increasing sensitivity of detecting the potential difference of the instrumental amplifier AMP1.

Therefore, since the low impedance circuit CB is connected to the emitter of the main transistor Q1a in which the main current flows and the low impedance circuit CA is connected to the emitter of the current detecting transistor Qs, the emitter of the transistor Q1a and the emitter of the transistor Qs are connected to each other at the low impedance. In addition, both the input terminals of the instrumental amplifier AMP1 are connected at the low impedance. As such, the current can be estimated without applying an excessive voltage between both of the input terminals of the instrumental amplifier AMP1. Namely, since the input and output terminals of the instrumental amplifier AMP1 are connected to the other emitter through the low resistances, there is less possibility that an excessive voltage is applied between both of the input terminals. Accordingly, the possibility of deterioration of each element by the induction voltage can be reduced minimum, and the current detection circuit 3 with high reliability can be provided.

As a second point, the current detection circuit 3 does not have a portion connected to the power converting portion 1a except for the emitter of the large power conducting transistor Q1a. In the conventional circuit, the current detection circuit has the path connected to the main circuit at a node other than the emitter of the transistor Q1a. Therefore, there is a problem that the induced current flows toward the other node from the emitter of the transistor Q1a due to the parasitic inductance generated at the emitter of the transistor Q1a when the transistor Q1 is turned off. In the circuit structure of the present embodiment, the current detection circuit 3 is connected to the main circuit only at one node. Therefore, it is less likely that the induced current will flow. As such, there is less possibility that the element is deteriorated according to the induced current, and thus the current detection circuit 3 having the high reliability can be provided.

Second Embodiment

Hereinafter, a second embodiment of the present disclosure will be described with reference to FIG. 4. Elements and circuits having the same or similar functions to those of the embodiment described above will be designated with the same or similar reference numbers, and descriptions thereof will be suitably omitted. Hereinafter, features of the present embodiment will be explained mainly based on the difference from the embodiment described above.

Figure 4:
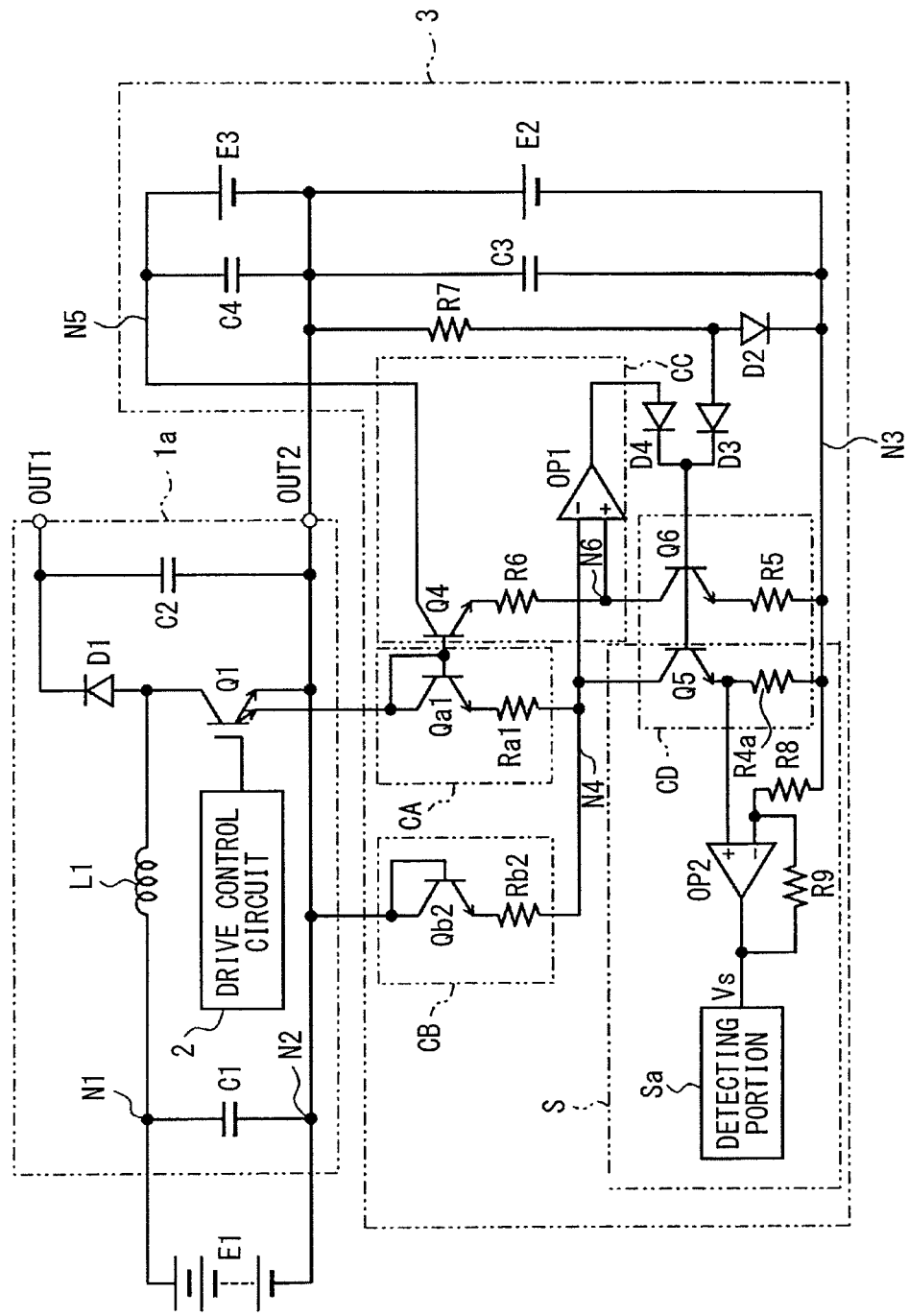
FIG. 4 is a diagram illustrating a circuit structure of a power conversion circuit according to a second embodiment of the present disclosure.

FIG. 4 is a diagram illustrating an electric structure of a power conversion circuit according to the present embodiment. Similar to the embodiment described above, a power converting portion 1a is made of a non-insulated- and boost chopper-type booster circuit. A DC voltage generation circuit E2 and a capacitor C3 are connected in parallel between a main power supply line N2 and a sub power supply line N3. A DC voltage generation circuit E3 and a capacitor C4 are connected in parallel between the main power supply line N2 and a sub power supply line N5. A current detection circuit 3 is operated by the voltage supplied from the DC voltage generation circuits E2 and E3.

A diode-connected transistor Qb2 and a resistor Rb2 are connected in series between one emitter of the main transistor Q1 and the node N4. Further, a diode-connected transistor Qa1 and a resistor Ra1 are connected in series between the other emitter of the main transistor Q1 and the node N4. The resistor Ra1 and the resistor Rb2 are commonly connected at the common connection node N4, and are connected to the sub power supply line N3 from the common connection node N4 through a collector-to-emitter of the transistor Q5 and the resistor R4a. Voltage of the common connection node N4 of the resistor Ra1 and the resistor Rb2 is applied to an inversion input terminal of an operation amplifier OP1.

On the other hand, the DC voltage generation circuit E3 is connected in parallel with the capacitor C4 to supply stable DC voltage. The DC voltage generated by the DC voltage generation circuits E2 and E3 is applied to a series circuit of a collector-to-emitter of the transistor Q4, a resistor R6, a collector-to-emitter of a transistor Q6, and a resistor R5. Voltage at a common connection node N6 of the resistor R6 and the collector of the transistor Q6 is applied to a non-inverting input terminal of an operation amplifier OP1.

A resistor R7 and a diode D2 are connected in series between the main power supply line N2 and the sub power supply line N3. The resistor R7 and the diode D2 are supplied with a current from the DC voltage generation circuit E2. A common connection node of the resistor R7 and the diode D2 is connected to the base of the transistor Q6 and the base of the transistor Q5 via a diode D3. The resistor R7 and the diodes D2 and D3 serve as a start-up circuit for applying a base current of the transistors Q5 and Q6. The start-up circuit applies the base current to the transistors Q5 and Q6 when the main transistor Q1 shifts from off to on, thereby to activate the current detection circuit 3.

The base of the transistor Q5 and the base of the transistor Q6 are applied with a control current from the output of the operation amplifier OP1 via a diode D4. A voltage between both ends of a resistor R4a is outputted, as a sensing signal voltage Vs, via an inverting amplifier constructed of combination of an operation amplifier OP2 and resistors R8 and R9. A detecting portion Sa detects this sensing signal voltage Vs.

An operation of the above-described structure will be described.

After the start-up circuit, which is provided by the resistor R7 and the diodes D2 and D3, activates the current detection circuit 3, the operation amplifier OP1 compares the voltage of the node N4 and the voltage of the node N6, and outputs a current according to this difference of the voltages, as the control current, to the transistors Q6 and Q5 via the diode D4. When the control current outputted from the operation amplifier OP1 increases, the transistors Q5 and Q6 increase the currents drawn from the nodes N4 and N6. On the contrary, when the control current outputted from the operation amplifier OP1 reduces, the transistors Q5 and Q6 reduce the currents drawn from the nodes N4 and N6. By this, the operation amplifier OP1 keeps the node N4 and the node N6 at the same potential.

Each resistance value is set so that the current, which is the total value of the currents assumed to flow in the resistor Ra1 and the resistor Rb2 when the same voltage drop occurs at the resistor Ra1 and the resistor Rb2 in this state, flows in the resistor R4a. In particular, it may be designed beforehand so that the resistance values satisfy the following relationship:

$$R5/R6 = R4a \times (1/Ra1 + 1/Rb2) \qquad (6)$$

In this case, in a control process where the operation amplifier OP1 keeps the node N4 and the node N6 at the same potential, the current that makes the resistor Ra1 and the resistor Rb2 have the same voltage drop flows in the resistor R4a. Therefore, the voltage drop at the resistor Rb2 and the voltage drop at the resistor Ra1 can be the same.

Since the operation amplifier OP1 controls the collector currents of the transistors Q5 and Q6 in this way, the voltage drop at the diode-connected transistor Qa1 and the resistor Ra1 and the voltage drop at the diode-connected transistor Qb2 and the resistor Rb2 can be controlled to the same voltage. As a result, the potential of the one emitter of the main transistor Q1 (the potential of the main power supply line N2: the collector potential of the transistor Qb2) and the potential of the other emitter of the main transistor Q1 (the collector potential of the transistor Qa1) can be controlled to be substantially the same potential.

In this case, the terminal voltage of the resistor R4a is proportional to the current flowing in the transistor Qa1 and the resistor Rat. Therefore, the inverting amplifier, which is provided by the operation amplifier OP2 and the resistors R8 and R9, performs inversion amplification of the terminal voltage of this resistor R4a. The detecting portion Sa detects this amplified voltage as the sensed detection voltage Vs. As such, the current of the one emitter of the main transistor Q1 can be estimated (detected).

When the circuit structure of FIG. 4 of the present embodiment is compared to FIGS. 2 and 3, the diode-connected transistor Qa1 and the resistor Ra1 are used as the circuit CA, and the diode-connected transistor Qb2 and the resistor Rb2 are used as the circuit CB. Further, the transistor Q4, the resistor R6 and the operation amplifier OP1 are used as the control circuit CC. The transistors Q5 and Q6 and the resistors Ra4 and R5 are used as the power source CD. The transistor Q5, the resistors R4a, R8 and R9, the operation amplifier OP2 and the detecting portion Sa are used as the detection circuit S. The transistor Q5 and the resistor R4a of this detection circuit S constitute a part of the control input-type power source CD. Even when such a circuit structure is employed, advantageous effects similar to the embodiment described above will be achieved.

Third Embodiment

Hereinafter, a third embodiment of the present disclosure will be described with reference to FIG. 5. Elements and circuits having the same or similar functions to those of the embodiments described above will be designated with the same or similar reference numbers, and descriptions thereof will be suitably omitted. Hereinafter, features of the present embodiment will be explained mainly based on the difference from the embodiments described above.

Figure 5:
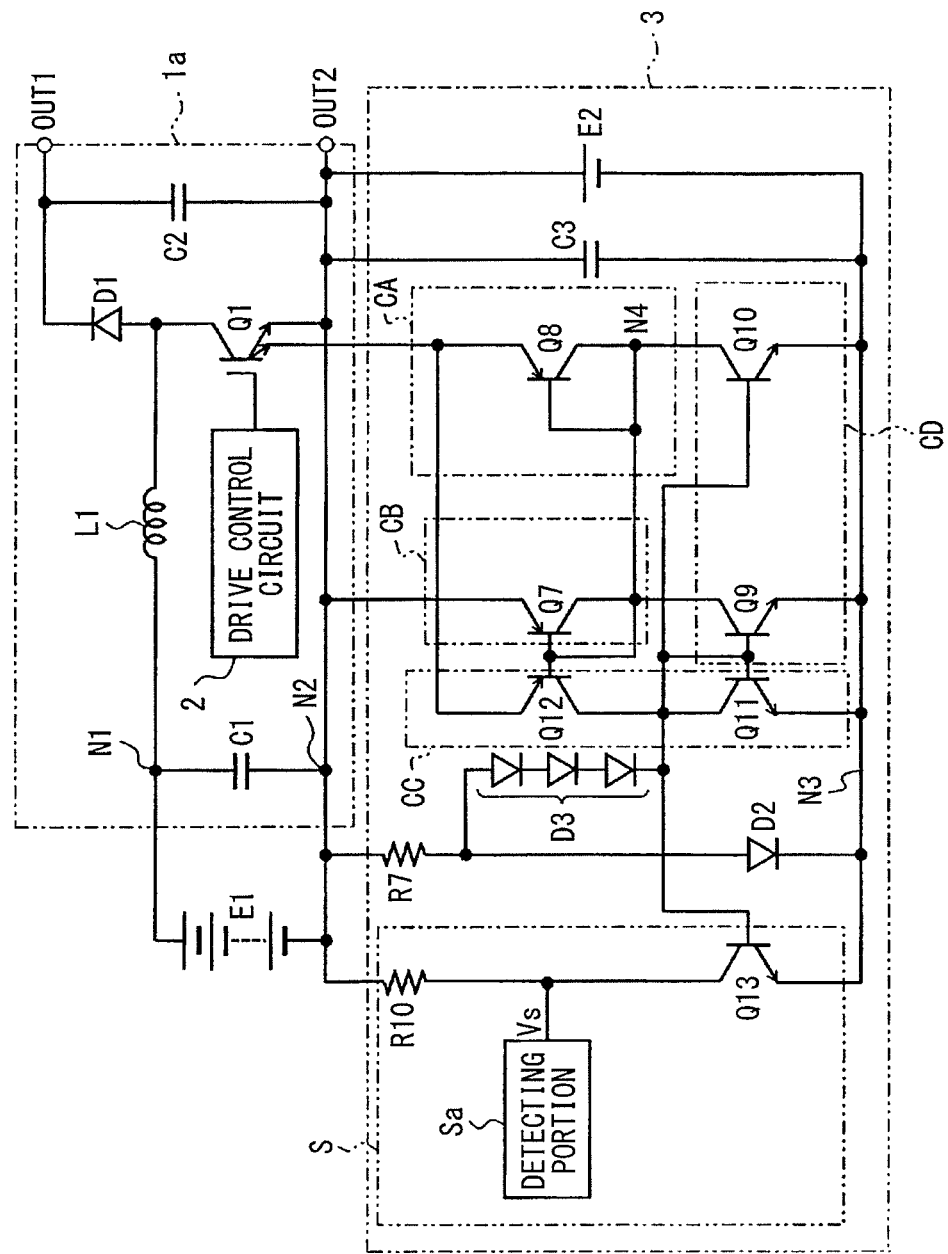
FIG. 5 is a diagram illustrating a circuit structure of a power conversion circuit according to a third embodiment of the present disclosure.

FIG. 5 is a diagram illustrating an electric structure of a power conversion circuit according to the present embodiment. Similar to the embodiments described above, a power converting portion 1a is provided by a non-insulated- and boost chopper-type booster circuit. A DC voltage generation circuit E2 and a capacitor C3 are connected in parallel between one emitter of a main transistor Q1 (main power supply line N2) and a sub power supply line N3. A current detection circuit 3 is operated by voltage supplied from the DC voltage generation circuit E2.

A diode-connected PNP transistor Q7 is connected to the one emitter of the main transistor Q1. A diode-connected PNP transistor Q8 is connected to the other emitter of the main transistor Q1.

Collectors and bases of the transistors Q7 and Q8 are connected to each other at a common connection node N4, and connected to a sub power supply line N3 from the common connection node N4 via a parallel connection circuit provided by a collector-to-emitter of an NPN transistor Q9 and a collector-to-emitter of an NPN transistor Q10. In this case, the transistor Q8 corresponds to the circuit CA, and the transistor Q7 corresponds to the circuit CB.

A start-up circuit provided by a resistor R7 and diodes D2 and D3 applies a starting current to a diode-connected transistor Q11. With this, the starting current also flows in the transistors Q9 and Q10, which are current mirror-connected to the transistor Q11.

The transistor Q8 and a transistor Q12 are current-mirror connected to each other, and its output current is supplied to the transistor Q11. The transistor Q11 is current mirror-connected to a transistor Q13. A collector current of the transistor Q11 is mirrored at the transistor Q13, and a sensing signal voltage Vs is outputted via an I/V conversion circuit by a resistor R10. A detecting portion Sa detects this sensing signal voltage Vs. In this case, a mirror ratio (emitter area ratio) of the transistors Q12:Q7:Q8 is defined as n:k:1. A mirror ratio (emitter area ratio) of transistors Q11:Q9:Q10 is defined as n:k:1.

As the transistors Q7, Q8 and Q12, transistors having the same property are used. As the transistors Q9 to Q11 and Q13, transistors having the same property are used. In this case, the same property means that the collector-to-emitter current is proportional to the emitter area ratio, for example, when the same base-to-emitter voltage and the same collector-to-emitter voltage are applied, between two target transistors to be compared. In this case, n and k are arbitrary positive real numbers.

A circuit operation of the present embodiment will be described. The DC voltage generation circuit E2 supplies the current to the resistor R7 and the diodes D2 and D3, and this start-up circuit applies the starting current to the base of the transistor Q11. After the starting, the diode D3 is inversely biased, and the starting current does not flow in the diode D3. Thus, the start-up circuit finishes its function. Since the transistor Q8 and the transistor Q12 are current mirror-connected to each other, the current with the value of n times the collector current of the transistor Q8 flows in the transistor Q12. Further, when the base current is ignored as being relatively smaller than the collector current, the collector current of the transistor Q12 and the collector current of the transistor Q11 are substantially equal to each other based on Kirchhoff's 1st law.

The transistor Q11 and the transistors Q9 and Q10 are current mirror-connected. Therefore, the current with the value of k/n times the collector current of the transistor Q11 flows as the collector current of the transistor Q9, and the current with the value of 1/n times the collector current of the transistor Q11 flows as the collector current of the transistor Q10. Considering that the current income and outgo at the node N4 is zero, the collector current of the transistor Q6 can be controlled to k times the collector current of the transistor Q8. Therefore, as the transistor Q7, a transistor that allows a current with the value of k times the current of the transistor Q8 when the same voltage as the transistor Q8 is applied is used. In particular, it is realized when the transistor Q7 has an emitter area of k times that of the transistor Q8.

By this configuration, the voltage drop between the emitter and the collector of the transistor Q7 and the voltage drop between the emitter and the collector of the transistor Q8 can be controlled to substantially the same voltage, and thus the one emitter and the other emitter of the main transistor Q1 can be controlled to have substantially the same potential.

When the I/V converting circuit, which is provided by the transistor Q13 and the resistor R10, outputs the sensing signal voltage Vs according to the collector current of the transistor Q11, the detection circuit Sa detects this sensing signal voltage Vs. The conduction current of the main transistor Q1 can be estimated (detected) as the detection circuit Sa detects the sensing signal voltage Vs. The reason is that, the collector current of the transistor Q11 is n times the collector current of the transistor Q10, and the collector current of the transistor Q10 is substantially equal to the collector current of the transistor Q8. Therefore, when the collector current value of the transistor Q11 is set to 1/n times, the current of the other emitter of the main transistor Q1 can be calculated, and thus the current of the one emitter of the main transistor Q1 can be calculated.

In the circuit structure of FIG. 5 of the present embodiment, as compared to FIGS. 2 and 3, the diode-connected transistor Q8 is used as the circuit CA, and the diode-connected transistor Q7 is used as the circuit CB. Further, the transistors Q11 and Q12 are used as the control circuit CC, and the transistors Q9 and Q10 are used as the power source CD. The transistor Q13, the resistor R10 and the detecting portion Sa are used as the detection circuit S.

According to the present embodiment, the emitter-to-collector voltage of the transistor Q7 and the emitter-to-collector voltage of the transistor Q8 can be controlled to substantially the same voltage. Therefore, advantageous effects substantially similar to those of the embodiments described above will be achieved. The current detection circuit 3 is provided by the semiconductor elements such as the transistors Q7 to Q13 as main components. Therefore, the number of composition of other linear elements (for example, resistor) can be reduced. The current detection circuit 3 has a structure suitable to be formed on the same semiconductor substrate, as the semiconductor integrated circuit device. Further, when the drive control circuit 2 is also integrated in the semiconductor integrated circuit device, integration further improves.

The base of each of the transistors Q7 to Q13 constituting the current detection circuit 3 is not connected directly to the one emitter of the transistor Q1 (a main current path through which a main current flows), and is less likely to be affected by the influence of overvoltage or overcurrent.

It is not always necessary that the transistor Q9 and the transistor Q10 are separate transistors, but the transistor Q9 and the transistor Q10 may be integrated into one transistor. In this case, however, a mirror ratio (emitter area ratio) of the transistor Q11 and the one transistor in which the transistors Q9 and Q10 are integrated may be adjusted. For example, in place of the transistor Q9 the mirror ratio (emitter area ratio) of which to the transistor Q11 is n:k and the transistor Q10 the mirror ratio (emitter area ratio) of which to the transistor Q11 is n:1, one transistor the mirror ratio (emitter area ratio) of which to the transistor Q11 is n:(k+1) may be provided.

It is to be noted that the current of the one emitter of the transistor Q1 has a predetermined current value. Therefore, when n is set to be large and k is set to be small, the total current of the current detection circuit 3 can be made small. As such, when the transistors Q11 and Q12 are designed to have larger emitter areas and the transistors Q7 and Q9 are designed to have smaller emitter areas, power consumption can be reduced. Further, when the current detection circuit 3 is formed on the same semiconductor substrate as the semiconductor integrated circuit device, the component area on the semiconductor substrate can be reduced. In addition, the total amount of the currents to be controlled is reduced with the reduction of the total amount of the current values of the current mirror circuit. Therefore, responsiveness of the circuit also improves.

Fourth Embodiment

Hereinafter, a fourth embodiment of the present disclosure will be described with reference to FIG. 6. Elements and circuits having the same or similar functions to those of the embodiments described above will be designated with the same or similar reference numbers, and descriptions thereof will be suitably omitted. Hereinafter, of the features of the present embodiment, only a portion different from the embodiments described above will be explained.

Figure 6:
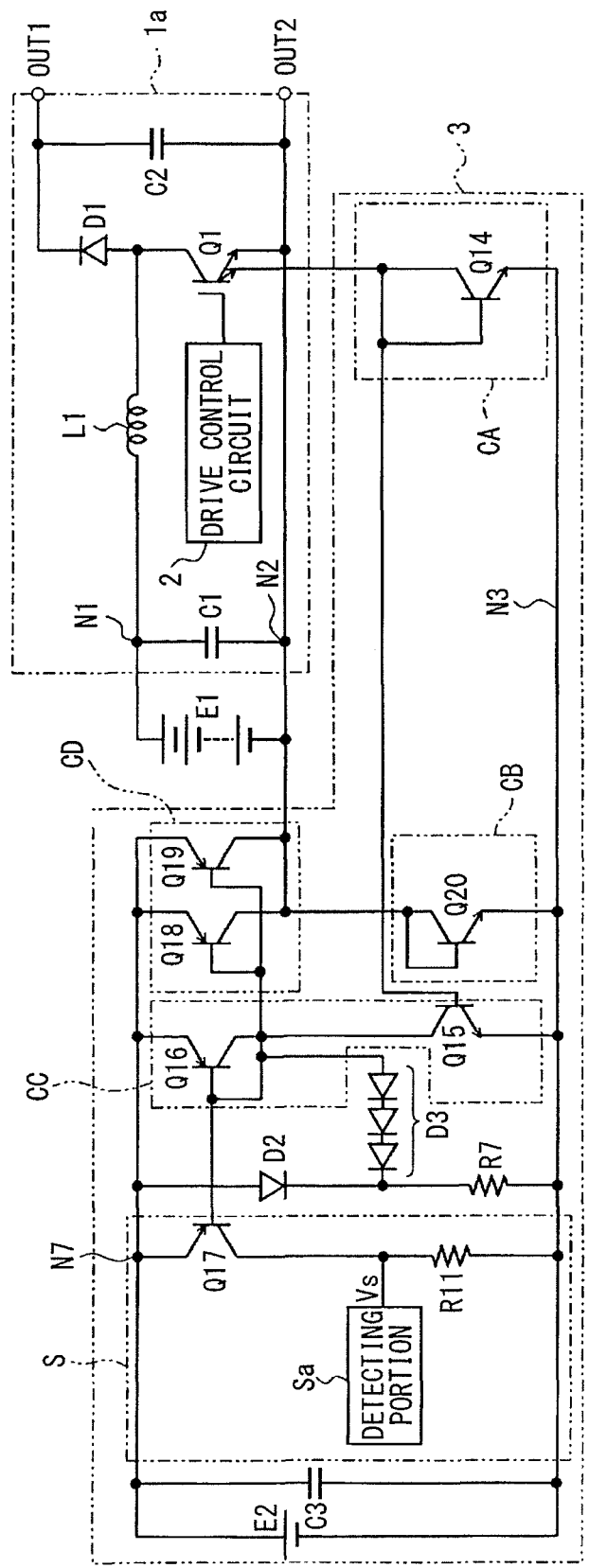
FIG. 6 is a diagram illustrating a circuit structure of a power conversion circuit according to a fourth embodiment of the present disclosure.

FIG. 6 is a diagram illustrating a structure of a current detection circuit according to the present embodiment. A power converting portion 1a is provided by a non-insulated- and boost chopper-type booster circuit, similar to the embodiments described above. A DC voltage generation circuit E2 and a capacitor C3 are connected in parallel with each other relative to a sub power supply line N3 as a reference potential node. A current detection circuit 3 is operated as the DC voltage generation circuit E2 supplies voltage between a sub power supply line N7 and the sub power supply line N3.

The other emitter of a main transistor Q1 is connected to the sub power supply line N3 via a diode-connected NPN transistor Q14. The transistor Q14 is current mirror-connected to an NPN transistor Q15. The transistor Q14 is connected to a sensing resistor R11 from the transistor Q15 via a current mirror circuit (Q16, Q17), which is connected to the sub power supply line N7.

The PNP transistor Q16 is current mirror-connected to a PNP transistor Q18 and a PNP transistor Q19. A collector current of the transistor Q16 is substantially the same as a collector current of the transistor Q15. Each of the transistor Q18 and the transistor Q19 mirrors the current flowing in the NPN transistor Q15. Between the sub power supply line N7 and the sub power supply line N3, an emitter-to-collector of the transistor Q18 and a diode-connected NPN transistor Q20 are connected in series to each other.

A mirror ratio (emitter area ratio) of the transistors Q15: Q20:Q14 is set to a ratio of n:k:1. A mirror ratio (emitter area ratio) of the transistors Q16:Q18:Q19 is also set to a ratio of n:k:1. As the transistors Q14, Q15 and Q20, transistors having the same property are used.

When a start-up circuit including diodes D2 and D3 and a resistor R7 is supplied with voltage from the DC voltage generation circuit E2, the start-up circuit draws a base current of the transistor Q16 and thus supplies a starting current.

An operation of the structure described above will be described. When the DC voltage generation circuit E2 supplies the current to the start-up circuit constructed of the resistor R7 and the diodes D2 and D3, the start-up circuit draws the starting current from the base of the transistor Q16. After the starting, the voltage of the diode D3 becomes reverse voltage, and thus the starting current stops. Therefore, the start-up circuit finishes its function.

The current of the other emitter of the main transistor Q1 is outputted to the diode-connected transistor Q14. Since the transistor Q14 is current mirror-connected to the transistor Q15, the current with the value of n times the collector current of the transistor Q14 is mirrored to the collector current of the transistor Q15. Further, the current mirror circuit (Q16, Q17) mirrors the collector current of the transistor Q15, and the collector current of the transistor Q17 is applied to the sensing resistor R11 as the mirror current.

On the other hand, the transistor Q16 is current mirror-connected to the transistors Q18 and Q19. Therefore, the transistors Q18 and Q19 are supplied with currents at a current ratio of k:1. Therefore, in the transistor Q20 in which the current same as the collector current of the transistor Q18 flows, the collector current with the value of k times the transistor Q14 flows. Therefore, as the transistor Q20, when a transistor in which the current with the value of k times the transistor Q14 flows when being applied with the same voltage as the transistor Q14 (in particular, a transistor an emitter area of which is k times the transistor Q14, for example) is used, the voltage drop at the collector-to-emitter of the transistor Q14 and the voltage drop at the collector-to-emitter of the transistor Q20 can be controlled to be substantially the same. As such, the potential of the one emitter of the main transistor Q1 and the potential of the other emitter of the main transistor Q1 can be controlled to be the same.

The current of the other emitter of the main transistor Q1 returns to the main power supply line N2 from the transistor Q19. Since a detecting portion Sa detects a sensing signal voltage Vs, the current of the main transistor Q1 can be estimated (detected).

In the circuit structure of FIG. 6 of the present embodiment, as compared with FIGS. 2 and 3, the diode-connected transistor Q14 is used as the circuit CA, and the diode-connected transistor Q20 is used as the circuit CB. Further, the transistors Q15 and Q16 are used as the control circuit CC, and the transistors Q18 and Q19 are used as the control input-type power source CD. The transistor Q17, the resistor R11 and the detecting portion Sa are used as the detection circuit S. This circuit structure corresponds to a structure in which the control input-type current source CD and the voltage source V are replaced in an equivalent circuit of FIGS. 2 and 3.

Also in the present embodiment, advantageous effects substantially similar to those of the embodiments described above will be achieved. In addition, since the current detection circuit 3 is constructed of the semiconductor elements such as the transistors Q14 to Q20 as main components, the number of other elements (such as a resistor) can be reduced. Therefore, the current detection circuit 3 has a structure suitable to be formed on the same semiconductor substrate as the semiconductor integrated circuit device.

Similar to the embodiments described above, since the base of each of the transistors Q14 to Q20 of the current detection circuit 3 is not connected to the one emitter of the main transistor Q1 (the main current path through which the main current flows), it is less likely to be affected by the influence of overvoltage or overcurrent.

Similar to the third embodiment, the transistor Q18 and the transistor Q19 may be integrated into one transistor. Moreover, when n and k are set to smaller values, the power consumption can be reduced. Also, when the current detection circuit 3 is formed on the same semiconductor substrate as the semiconductor integrated circuit device, the area of the semiconductor substrate can be reduced, and the responsiveness of the circuit is improved.

Fifth Embodiment

Hereinafter, a fifth embodiment of the present disclosure will be described with reference to FIG. 7. Elements and circuits having the same or similar functions to those of the third embodiment will be designated with the same or similar reference numbers, and descriptions thereof will be suitably omitted. Hereinafter, features of the present embodiment will be explained mainly based on the difference from the embodiment described above.

Figure 7:
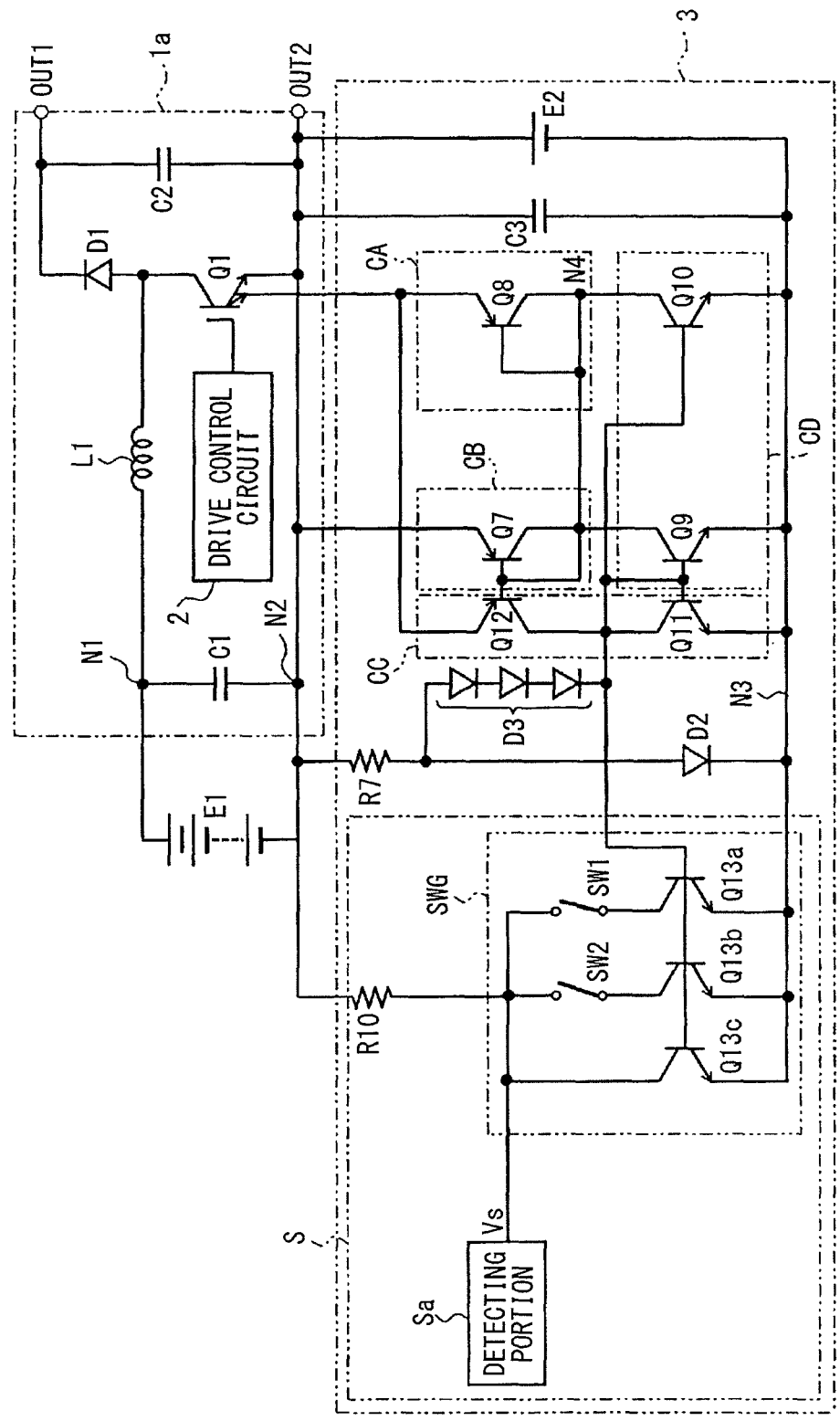
FIG. 7 is a diagram illustrating a circuit structure of a power conversion circuit according to a fifth embodiment of the present disclosure.

FIG. 7 is a diagram illustrating an electric structure of a current detection circuit according to the present embodiment. Similar to the embodiment described above, a power converting portion 1a is constructed of a non-insulated- and boost chopper-type booster circuit. Similar to the third embodiment, a body of the current detection circuit 3 includes a start-up circuit, which is provided by combination of a resistor R7 and diodes D2 and D3, and a current mirror-type current control circuit (current detection circuit), which is provided by combination of transistors Q7 to Q12, and thus indicates substantially a similar circuit structure to the circuit described in the third embodiment.

In this case, a difference from the third embodiment is that a switching circuit (switching portion) SWG is provided, in place of the transistor Q13 of the third embodiment. The switching circuit SWG switches an amplification degree of current by switching a mirror ratio of input current to output current. The switching circuit SWG includes a plurality of NPN transistors Q13a to Q13c and switches SW1 to SW2. The bases of the transistors Q13a to Q13c are commonly connected to each other, and the collectors of the transistors Q13a to Q13c are connected to or disconnected from each other according to on and off states of the switches SW1 and SW2.

Therefore, the transistors Q13a to Q13c can be connected in parallel by controlling the switches SW1 and SW2 to be on by a non-illustrated external circuit. The mirror ratio of the current mirror circuit (Q11, Q13a to Q13c) can be adjusted in accordance with the on and off states of the switches SW1 and SW2.

That is, when the collectors of these transistors Q13a to Q13c are connected to each other, a collector area can be increased and an IN conversion amplification degree can be increased. On the contrary, when the collectors of the transistors Q13a to Q13c are disconnected from each other, since the number of transistors to be operated is reduced, the I/V conversion amplification degree can be lowered. In this way, the I/V amplification degree can be controlled.

According to the present embodiment, since the switching circuit SWG switches the mirror ratio of the input current to the output current of the current mirror circuit (Q11, Q13a to Q13c), the I/V conversion amplification degree can be controlled, and a current detection range can be increased.

Sixth Embodiment

Hereinafter, a sixth embodiment of the present disclosure will be described with reference to FIG. 8. Elements and circuits having the same or similar functions to those of the fourth embodiment will be designated with the same or similar reference numbers, and descriptions thereof will be suitably omitted. Hereinafter, features of the present embodiment will be explained mainly based on the difference from the embodiment described above.

Figure 8:
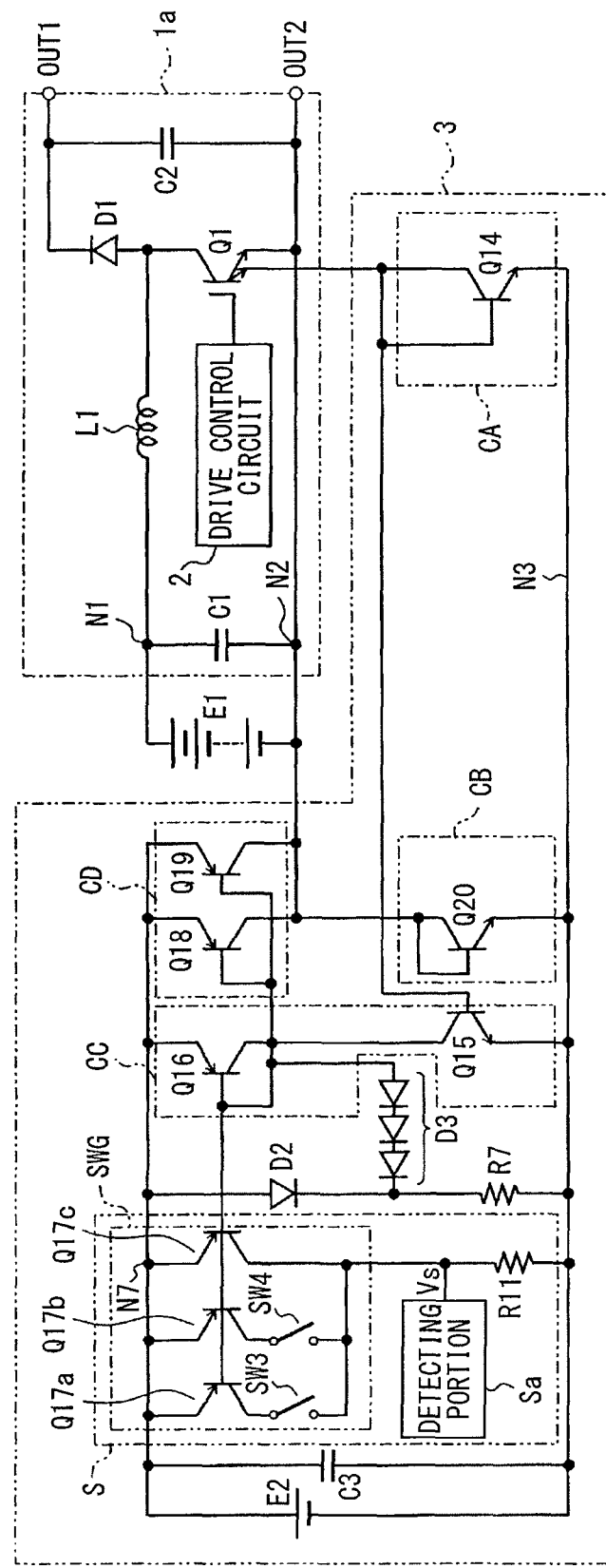
FIG. 8 is a diagram illustrating a circuit structure of a power conversion circuit according to a sixth embodiment of the present disclosure.

FIG. 8 is a diagram illustrating an electric structure of a power conversion circuit according to the present embodiment. Similar to the embodiment described above, a power converting portion 1a is constructed of a non-insulated- and boost chopper-type booster circuit. Similar to the fourth embodiment, the body of the current detection circuit 3 has a circuit structure substantially similar to that of the fourth embodiment, and includes a start-up circuit, which is provided by combination of a resistor R7 and diodes D2 and D3, and a circuit provided by combination of the transistors Q14 to Q20.

In place of the transistor Q17 of the fourth embodiment, PNP transistors Q17a to Q17c are provided. Emitters of the transistors Q17a to Q17c are commonly connected through a sub power supply line N7. The bases of these transistors Q17a to Q17c are commonly connected. Connection or disconnection of the collectors of these transistors Q17a to Q17c can be selected by switches SW3 and SW4.

That is, when the collectors of these transistors Q17a to Q17c are connected to each other, a collector area increases. With this, the I/V conversion amplification degree can be increased. On the contrary, when the collectors of the transistors Q17a to Q17c are disconnected from each other, the number of transistors to be operated is reduced. Therefore, the I/V conversion amplification degree can be reduced. In this way, the I/V conversion amplification degree can be controlled.

According to the present embodiment, the switching circuit SWG can switch the mirror ratio of the input current to the output current of the current mirror circuit (Q16, Q17a to Q17c). Therefore, the I/V conversion amplification degree can be controlled, and the current detection range can be increased.

Seventh Embodiment

Hereinafter, a seventh embodiment of the present disclosure will be described with reference to FIG. 9. Elements and circuits having the same or similar functions to those of the third embodiment will be designated with the same or similar reference numbers, and descriptions thereof will be suitably omitted. Hereinafter, features of the present embodiment will be explained mainly based on the difference from the embodiment described above.

Figure 9:
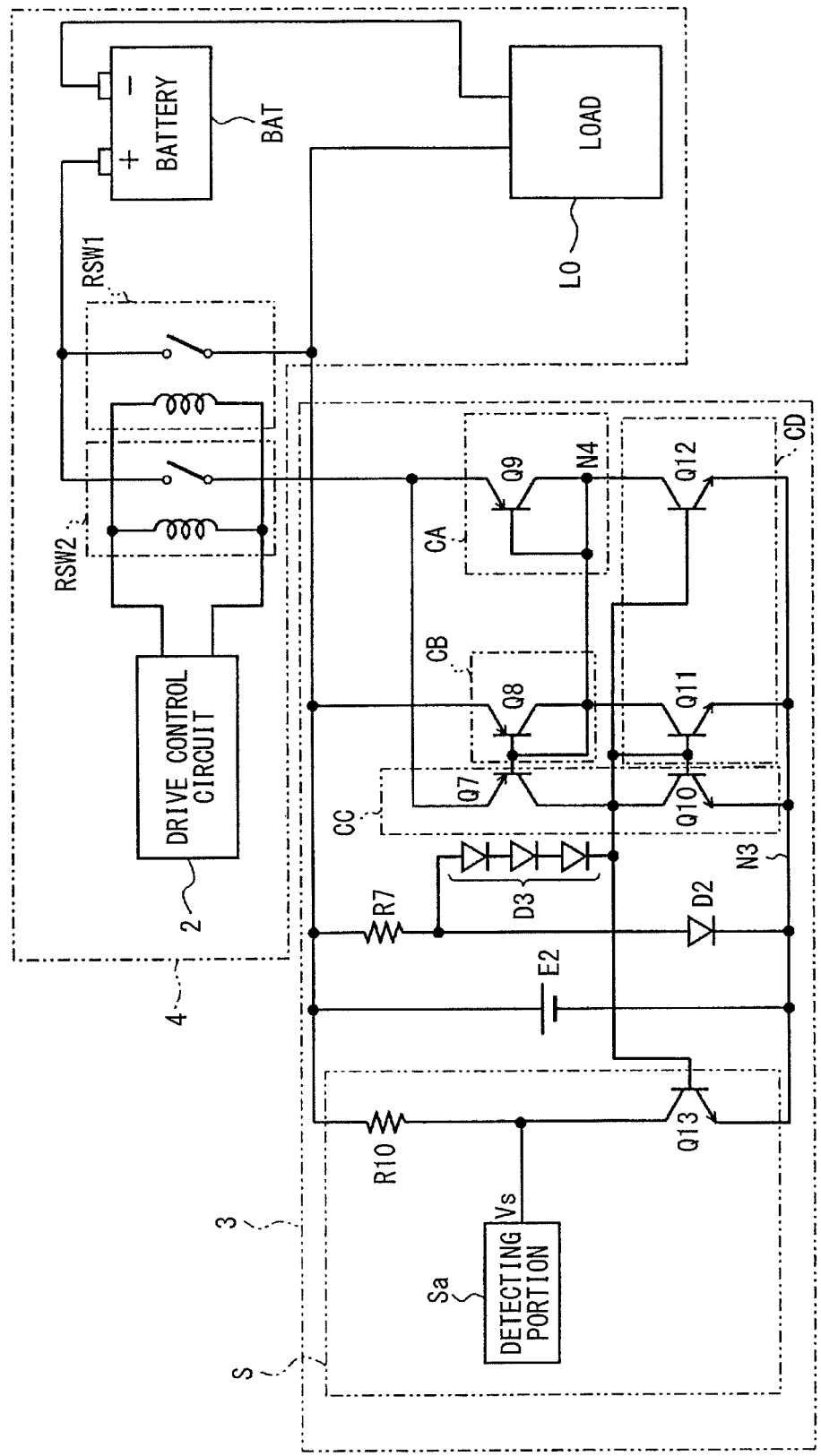
FIG. 9 is a diagram illustrating a circuit structure of a power conversion circuit according to a seventh embodiment of the present disclosure.

FIG. 9 is a diagram illustrating a power supply circuit according to the present embodiment. As shown in FIG. 9, a relay switch (mechanical switch) RSW1 is provided on a power line extending from a battery BAT to a load LO. This relay switch RSW1 corresponds to the large power conducting transistor Qa1 explained in the third embodiment. For example, this relay switch RSW1 has a current capacity greater than a semiconductor switch, and thus can conduct large electric power.

A current detecting relay switch (mechanical switch) RSW2 is provided in parallel with this relay switch RSW1. This relay switch RSW2 conducts a conduction current from the battery BAT toward a detection current path adjacent to a current detection circuit 3.

A drive control circuit 2 supplies electricity to the load LO by on-controlling the relay switch RSW1. In this case, the current detection circuit 3 detects the current by on-controlling the relay switch RSW2 simultaneously with the relay switch RSW1. Also in such a circuit structure, the current can be detected by the function similar to the embodiment (third embodiment) described above.

In the first to sixth embodiments, embodiments of detecting the conduction current of the main transistor Q1 of the power conversion circuit 1 are indicated. In the present embodiment, the conduction current of the relay switch RSW1 (RSW2) of a load conduction circuit 4 that supplies electricity from the battery BAT to the load LO can be estimated (detected).

Although not illustrated, when the detecting portion Sa is connected to the drive control circuit 2, the detecting portion Sa estimates (detects) the current value of the relay switch RSW1 and outputs the estimated current value to the drive control circuit 2. The drive control circuit 2 compares the estimated current value with a rated current value of the load LO at a subsequent stage. When the drive control circuit 2 detects that the estimated current value exceeds a threshold current value lower than the rated current value, the drive control circuit 2 can turns off the relay switch RSW1 according to the detection result. Moreover, since the current value can be detected with sufficient linearity, the current value can be used for power control. For example, when a residual quantity of the battery BAT is small, a load LO having large power consumption is specified. Thus, the amount of current conducted to the specified load LO can be controlled.

In the present embodiment, the ratio of the amount of conduction current of the large power conducting relay switch RSW1 and the amount of conduction current of the current detecting relay switch RSW2 is determined by on-state resistance of each of the switches RSW1 and RSW2. Therefore, to obtain arbitrary current ratio, a resistor for adjustment may be added to each of or both of the relay switches RSW1 and RSW2 in series.

An object to detect current is not limited to the power conversion circuit (main transistor Q1) indicated in the embodiments described above, and the current detection may be applied to any circuit such as the load conduction circuit 4. In addition, any circuit may be employed as long as a current of the circuit can be detected.

Modification of Technical Ideas of First to Seventh Embodiments

Next, electric structural blocks of the circuit modes explained in the first to seventh embodiment described above and modified modes thereof will be explained with reference to FIG. 10 and FIG. 11. The circuits explained in the above-mentioned first to seventh embodiments can be replaced with the circuit block having the structure of FIG. 2 as a basic structure.

Figure 10:
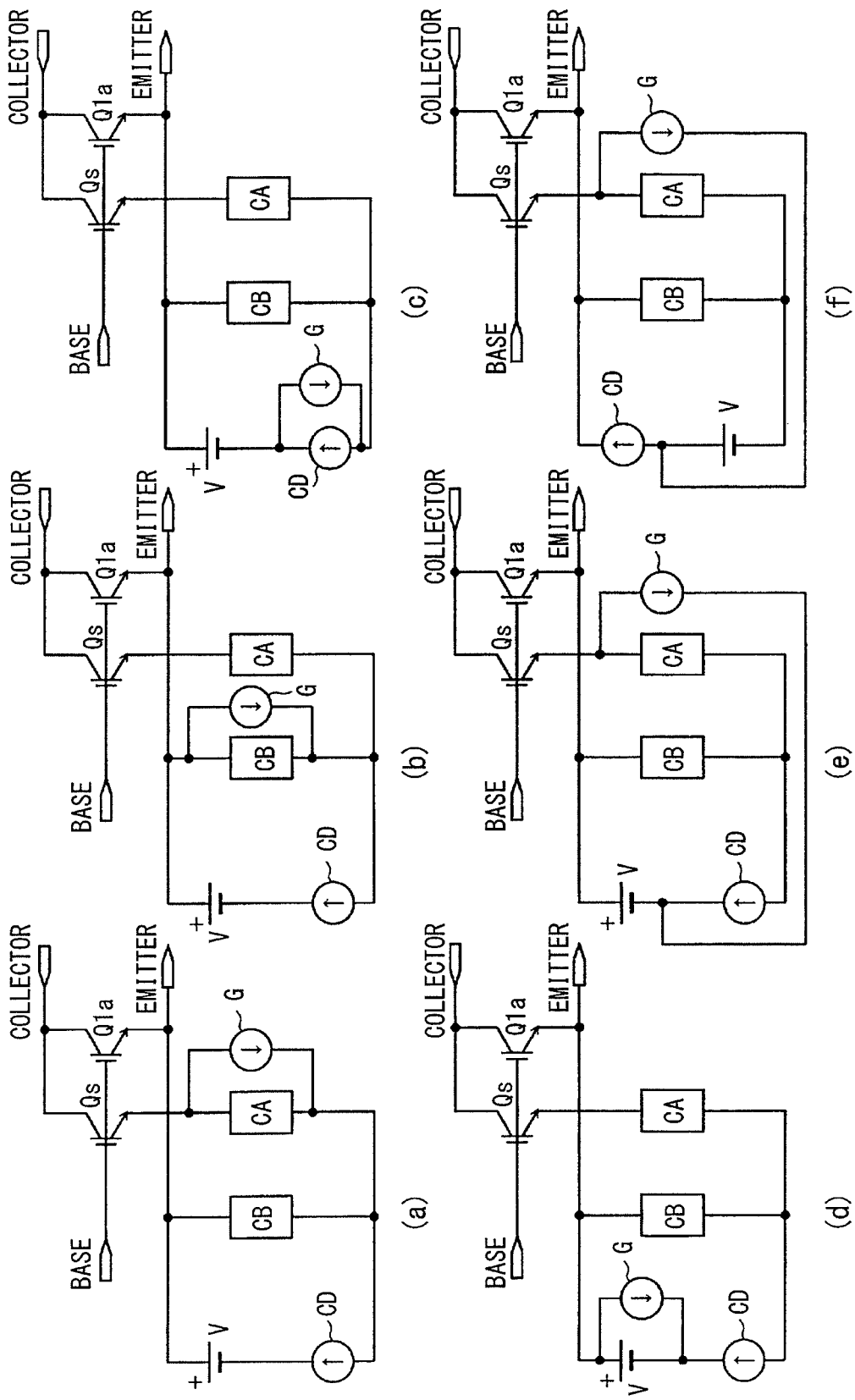
FIG. 10 (a) to (f) of FIG. 10 are diagrams illustrating electric structures for explaining a block structure of a main part of modified examples of the afore-mentioned embodiments.

Further, modifications thereof are illustrated in (a) to (f) of FIG. 10. In (a) to (f) of FIG. 10, circuits each provided with a control input-type current source G that supplies a current proportional to the current source CD are illustrated. For example, the control input-type current source G may be connected in parallel with arbitrary component (circuit) of the circuit CA ((a) of FIG. 10), the circuit CB ((b) of FIG. 10), the current source CD ((c) of FIG. 10), and the voltage source V ((d) of FIG. 10). It is to be noted that the current source CD outputs a current that causes equal voltage drop in the circuit CA and the circuit CB, considering the current of the current source G.

As shown in (e) of FIG. 10, in a case where the voltage source V and the current source CD are connected in series in this order, the current source G ((e) of FIG. 10) may be connected in parallel with the circuit CA and the current source CD. As shown in (f) of FIG. 10, in a case where the current source CD and the voltage source V are connected in series in this order, the current source G ((f) of FIG. 10) may be connected in parallel with the circuit CA and the voltage source V. Further, as the current source G, a current source that is used as a part of the control circuit CC or the voltage source V (DC voltage generation circuits E2, E3) may be used. As the voltage source V, a circuit connected in any way may be used as long as the circuit can apply a bias current to the circuit CB for operation.

Next, examples of selection of the main transistor Q1, the circuit CA, the circuit CB, the control circuit CC, the control input-type current source CD, the voltage source V (DC voltage generation circuits E2, E3) and the detection circuit S will be explained.

<Regarding Main Transistor Q1 (Large Power Conducting Transistor Q1a, Current Detecting Transistor Qs)>

In regard to the main transistor Q1, the transistor Q1a and the transistor Qs preferably have a relationship where emitter currents (terminal currents) proportional to each other flow in the transistor Q1a and the transistor Qs under a condition where the voltage applied to the gate-to-emitter of each of the transistors Q1a and Qa is the same. Further, it is preferable to configure so that the current flowing in the current detecting transistor Qs is relatively and sufficiently smaller than the current flowing in the large power conducting transistor Q1a (for example, approximately a few hundredth to a few thousandth).

Cell output of the current detecting transistor Q1a may be provided by one or multiple emitters (channel structure (cell structure)), and cell output of the large power conducting transistor Qs may be provided by a part of or the whole of the remaining emitter (channel structure (cell structure)). The multi-emitter IGBT has a multi-channel structure. Therefore, the elements (Q1a, Qs) having the same property can be easily manufactured, and the linearity of the output current relative to the input current can be improved.

Figure 11:
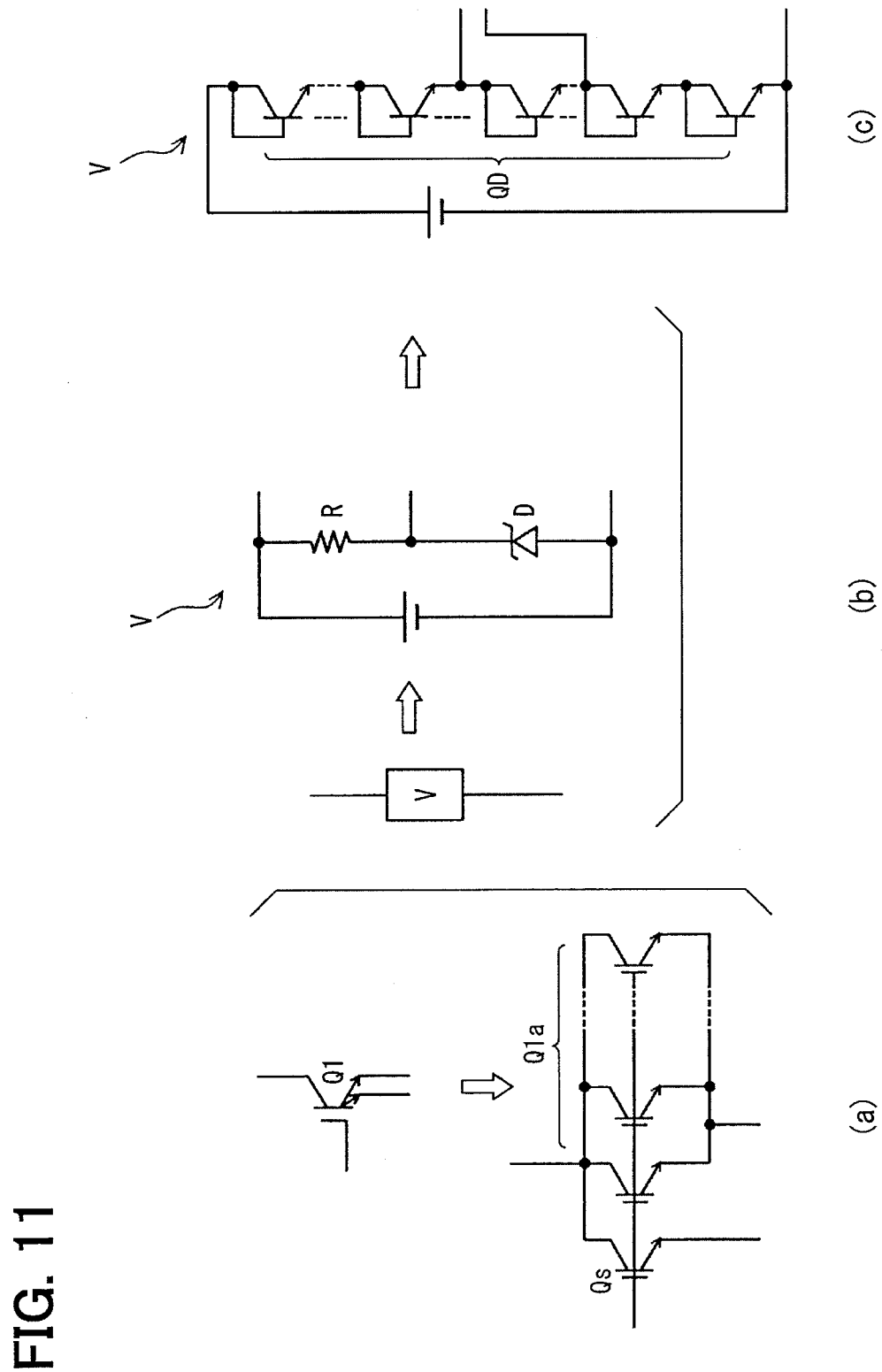
FIG. 11 (a) of FIG. 11 is a diagram illustrating an equivalent circuit of a multi-emitter IGBT, and (b) and (c) of FIG. 11 are modified examples of a voltage source.

In place of the multi-emitter (multi-channel) type main transistor Q1, which has the common collector and the common base, the large power conducting transistor Q1a and the current detecting transistor Qs may be made by combining separate transistors, as shown in (a) of FIG. 11. For each of the large power conducting transistor Q1a and the current detecting transistor Qs, arbitrary semiconductor switching element, such as IGBT, MOSFET (Metal-Oxide-Semiconductor Field-Effect Transistor), bipolar transistor, and JFET (Junction Field-Effect Transistor), may be used. Further, each of the large power conducting transistor Q1a and the current detecting transistor Qs may not be limited to the semiconductor switching element, but may be provided by a mechanical control switch, such as the relay switch RSW1 and RSW2, as indicated in the seventh embodiment.

<Regarding Voltage Source V (DC Voltage Generation Circuits E2 and E3)>

Arbitrary constant voltage circuit may be employed to the voltage source V (the DV voltage generation circuit E2 and E3), irrespective of a general DC power source circuit. As shown in (b) of FIG. 11, a constant voltage circuit provided by combination of a DC voltage source, a resistor R and a Zener diode may be employed. In (c) of FIG. 11, a plurality of diode-connected transistors QD are connected in series to each other to form a constant voltage circuit, and a voltage is supplied from a DC voltage source to this constant voltage circuit. A DC voltage obtained by dividing from a lower voltage circuit of the constant voltage circuit may be used. The circuit shown in (c) of FIG. 11 can be provided only by semiconductor elements. Therefore, it becomes easy to integrate the circuit into the semiconductor integrated circuit device.

<Regarding the Circuit CA (Second Circuit) and the Circuit CB (First circuit)>

In the embodiments described above, each of the circuit CA and the circuit CB is provided by the two-terminal circuit. The circuit CA and the circuit CB having any structure can be employed as long as the currents proportional to each other can be conducted when the voltage drop ΔVA of the circuit CA and the voltage drop ΔVB of the circuit CB are the same.

For example, in the first embodiment, the circuit CA is provided by the fixed resistor Rat, and the circuit CB is provided by the fixed resistor Rb2. In this case, the current ratio n of the resistors Ra1:Rb2 is equal to the reciprocal of a DC resistance ratio.

In place of the fixed resistor, diodes having the same property may be used as the circuit CA and the circuit CB. In this case, the current ratio n is equal to the ratio of the number of diodes or the area ratio of PN junction on the semiconductor substrate. A MOSFET in which the circuit CA is a fixed resistor and the circuit CB serves as the resistance may be used as long as the current flowing in the circuit CA and the current flowing in the circuit CB have a proportional relationship to each other. As another example, a diode connection of a bipolar transistor may be used as the circuit CA and a diode may be used as the circuit CB as long as forward bias voltages of pn junction are the same on the same semiconductor substrate.

Each of the circuit CA and the circuit CB may not be necessarily made of a single electronic component or element, but may be made of combination of a plurality of electronic components or elements. The embodiments in which the circuit CA and the circuit CB are made of the same type of component or element are mainly described. Alternatively, the circuit CA and the circuit CB may be made using different types of component or element. Therefore, any circuit may be used as the circuit CA and the circuit CB as long as the circuit has two or more terminals and satisfies the functions described above.

<Regarding Voltage Source V (DC Voltage Generation Circuits E2, E3) and Control Input-Type Current Source CD>

The voltage source V and the control input-type current source CD may be connected in any direction as long as the voltage source V and the control input-type current source CD are connected in series to each other. The specific example corresponds to the third embodiment and the fourth embodiment.

<Regarding Control Circuit CC>

The control circuit CC detects the voltage drop or the conduction current of the two-terminal circuit CA, and controls the current flowing in the current source CD. The control circuit CC performs control to conduct current to the current source CD, the current causing the voltage drop in the circuit CB equal to the voltage drop of the circuit CA. The control processing in this case may be an analog processing or a digital processing, and may be a current mirror circuit having a mirror ratio with fixed times.

<Regarding Detection Circuit S>

The detection circuit S outputs a signal according to a current command value of the current source CD outputted from the control circuit CC. The signal processing in this case may also be an analog processing or a digital processing. In this way, variously modified circuit structures may be employed.

Eighth Embodiment

Figure 12:
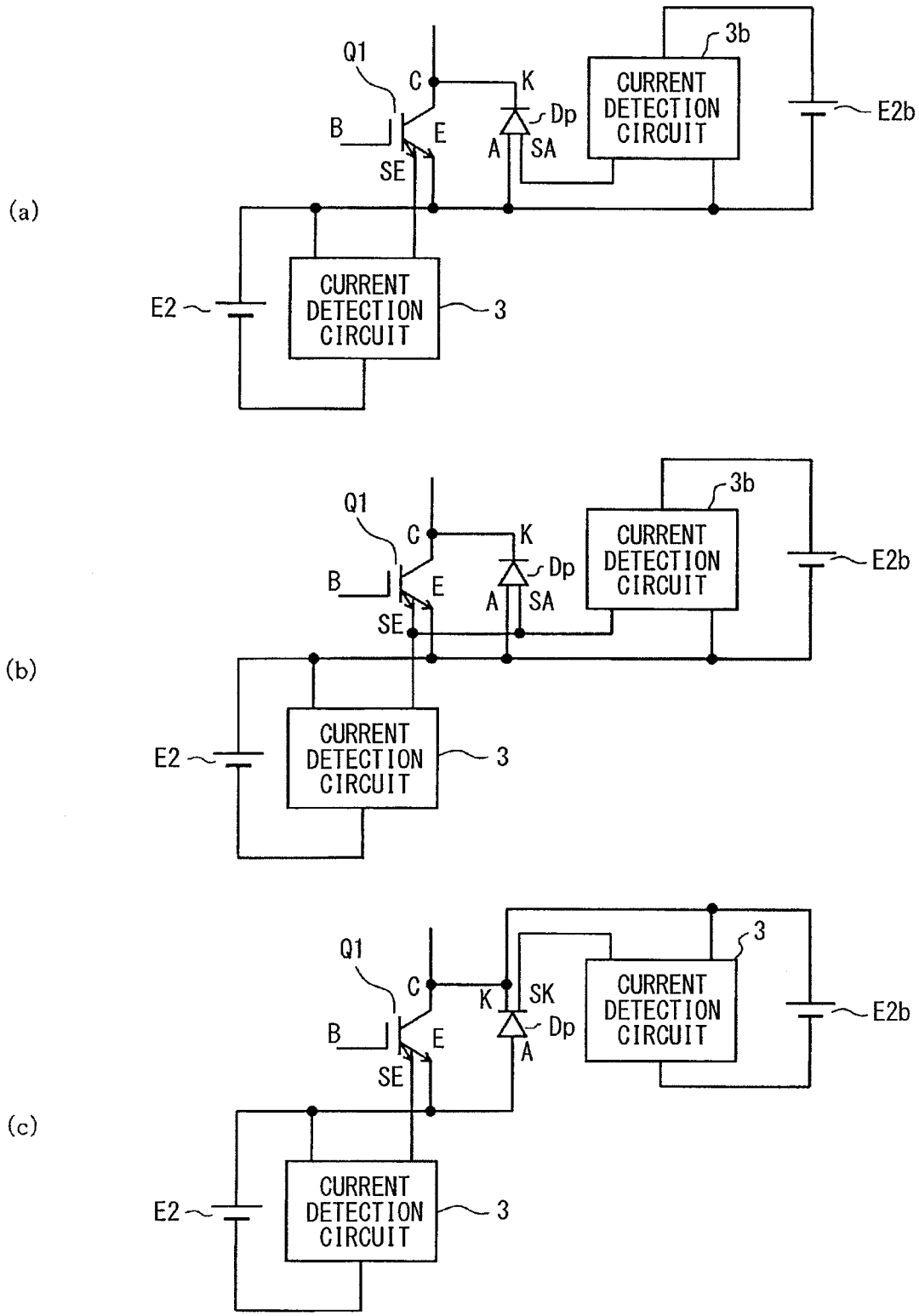
FIG. 12 (a) of FIG. 12 is a diagram illustrating a block structure of a main part of a current detection circuit according to an eighth embodiment of the present disclosure, and (b) and (c) of FIG. 12 are modified examples of (a) of FIG. 12.
Figure 13:
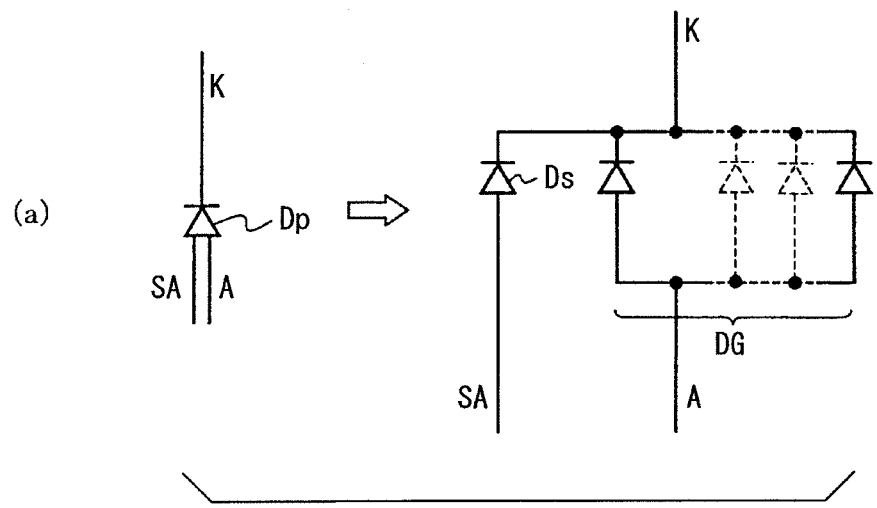
FIG. 13 (a) of FIG. 13 is a diagram illustrating an equivalent circuit of a multi-cell diode in which anode terminals are separate, and (b) of FIG. 13 is a diagram illustrating an equivalent circuit of a multi-cell diode in which cathode terminals are separate.
Figure 13:
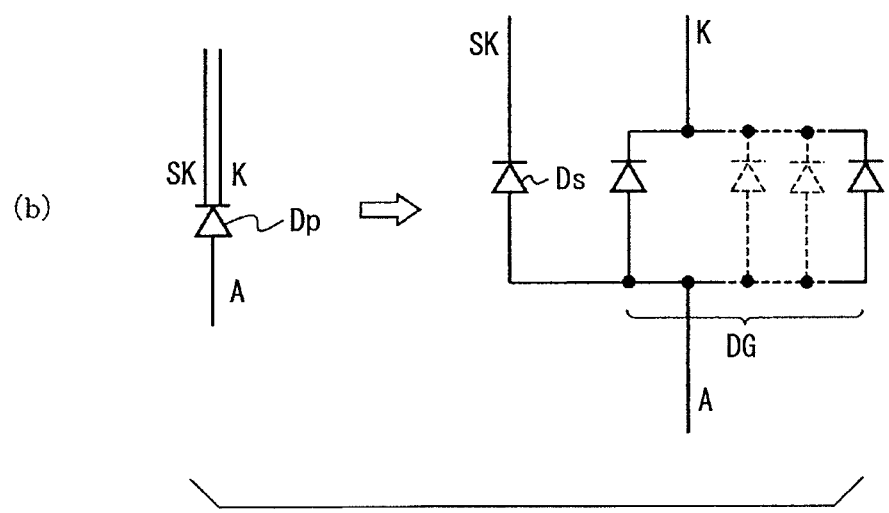
Figure 14:
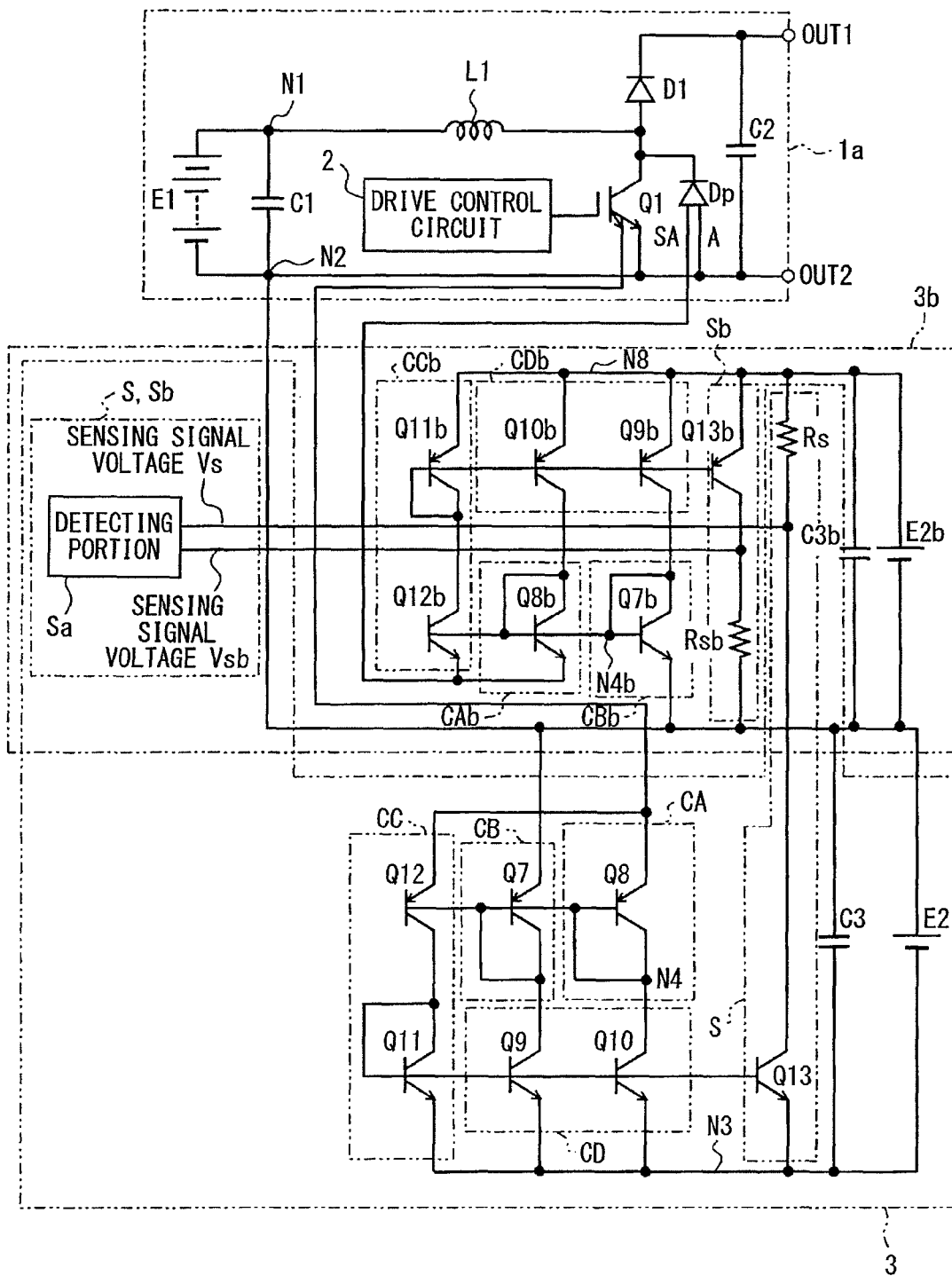
FIG. 14 is a diagram illustrating a circuit block of a power conversion circuit according to an eighth embodiment of the present disclosure.

FIGS. 12 to 14 are diagrams illustrating an eighth embodiment of the present disclosure. A difference from the embodiments described above is that the conduction current of the diode (particularly, free wheeling diode) is detected using the current detection circuit indicated in the embodiment described above. Parts same as or similar to those of the embodiments described above will be designated with the same or similar reference numbers, and description thereof will be omitted as necessary. Hereinafter, the difference will be explained.

(*a*) to (*c*) of FIG. 12 are diagrams illustrating arrangement examples of a current detection circuit that detects conduction current of a free wheeling diode Dp in a case where a main transistor Q1 and the free wheeling diode Dp, which is connected to the main transistor Q1 in an anti-parallel manner, are for example disposed in the same package.

As shown in (*a*) of FIG. 12, the free wheeling diode Dp is connected to the main transistor Q1 in the anti-parallel manner. The main transistor Q1 and the free wheeling diode Dp are integrally disposed in the package. The power conversion circuit 1 for the use of large electric power detects the current conducted to the free wheeling diode Dp, and performs feedback control based on the detected current value, thereby to contribute to improve the power conversion efficiency. In the present embodiment, therefore, a current detection circuit 3*b* detects the conduction current of the free wheeling diode Dp.

In (*a*) of FIG. 12, the current detection circuit 3 indicates the current detection circuit connected to the other emitter of the main transistor Q1 in the embodiment described above.

In the structure shown in (*a*) of FIG. 12, the current detection circuit 3*b* is provided as a circuit separate from the current detection circuit 3.

Since the free wheeling diode Dp is connected in the forward direction from the emitter toward the collector of the main transistor Q1. Therefore, the conduction direction of the forward current of the free wheeling diode Dp is opposite to the conduction direction of the main transistor Q1. Therefore, it is configured such that bias voltage E2*b* is applied to the current detection circuit 3*b* in the opposite direction to bias voltage E2 applied to the current detection circuit 3.

The free wheeling diode Dp shown in (*a*) of FIG. 12 is provided by a so-called multi-cell diode in which a plurality of diodes are connected in parallel. (*a*) of FIG. 13 illustrates an equivalent circuit of the multi-cell diode. Cathodes of all the diode elements connected in parallel with each other are commonly connected. An anode of a part of the diode elements constituting the free wheeling diodes Dp is provided as an anode of a current detecting diode Ds, and a parallel-connected node of the anodes of the other diode elements is provided as an anode of a large current conducting diode DS.

In a case where a current detecting anode SA and a large current conducting anode A are separate, as shown in (*b*) of FIG. 12, the current detecting anode SA and a current detecting emitter SE may be connected to each other. By this connection, the number of output terminals outputting from the package can be reduced.

The cathodes of the diode elements of the multi-cell structure shown in (*a*) of FIG. 13 are commonly connected. Alternatively, as shown in (*b*) of FIG. 13, the cathodes of the diode elements of the multi-cell structure may be separated into a current detecting cathode SK and a large current conducting cathode K, and the anodes of the diode elements of the multi-cell structure may be commonly connected to form the anode A. In this case, the current detection circuit explained in the above-mentioned embodiment is connected, as shown in (*c*) of FIG. 12.

FIG. 14 is a diagram illustrating a specific example of a circuit in which the structure of the third embodiment described above is employed to a current detection circuit for detecting a diode current. As shown in FIG. 14, a current detection circuit 3 that detects a current of a main transistor Q1 has substantially a similar structure to the current detection circuit of the third embodiment shown in FIG. 5. Therefore, although a detail description thereof will be omitted, an I/V conversion circuit of an output stage is provided by a transistor Q13 and a resistor Rs connected in series.

Similarly, a current detection circuit 3*b* that detects the diode current also has the structure of the current detection circuit 3 of the third embodiment described above as the basic structure. The current detection circuit 3*b* detects a forward current of a free wheeling diode Dp connected in a forward direction from the emitter toward the collector of the main transistor Q1. It is to be noted that the start-up circuit indicated in the third embodiment described above is omitted in FIG. 14.

In FIG. 14, structural transistors having the same or similar function to the structural transistors Q7 to Q12 of the current detection circuit 3 and the transistor Q13 of the I/V conversion circuit are provided with a suffix "b". Also, functional parts having the same or similar function to the functional parts of the circuit CA, the circuit CB, the control circuit CC, the control input-type current source CD, and the detection circuit S are provided with a suffix "b".

In the circuit shown in FIG. 14, the resistor Rs is connected to the transistor Q13 in series. A mirror current of the transistor Q13 is conducted to the resistor Rs, and the detecting portion Sa estimates (detects) the current of the main transistor Q1 by detecting the terminal voltage of the resistor Rs.

A diode-connected NPN transistor Q7b is connected to a main anode A of the free wheeling diode Dp. A diode-connected NPN transistor Q8b is connected to a sensing anode SA of the free wheeling diode Dp. The collectors (bases) of the transistor Q7b and the transistor Q8b are commonly connected, and are connected to a sub power supply line N8 from a common connection node N4b via collector-to-emitters of the NPN transistors Q9b and Q10b.

The non-illustrated start-up circuit is provided by combination of a resistor and a diode. As the start-up circuit draws the starting current from the base of the diode-connected transistor Q11b, the starting current is also drawn from the bases of the transistor Q9b and Q10b.

On the other hand, the transistor Q8b and the transistor Q12b are current mirror-connected to each other, and the output current is fed back to the transistor Q11b. The transistor Q11b is current mirror-connected to the transistors Q9b, Q10b and Q13b. Therefore, the current proportional to the collector current of the transistor Q11b at a predetermined rate can be supplied to each of the transistors Q9b and Q10b, and a collector-to-emitter voltage of the transistor Q7b and a collector-to-emitter voltage of the transistor Q8b can be made the same voltage.

The collector current of the transistor Q11b is mirrored by the transistor Q13b. The detection circuit S detects the terminal voltage of the sensing resistor Rsb that is connected to the transistor Q13b in series, and outputs the detected voltage as a voltage value depending on the detection current of the conduction current of the free wheeling diode Dp. In this way, the forward current of the free wheeling diode Dp can be detected.

Summary of Embodiment

According to the present embodiment, the emitter current of the main transistor Q1 can be estimated (detected), and the current of the free wheeling diode Dp can be estimated (detected).

Further, in the case where the circuit structure shown in FIG. 14 is employed, the similar effects will be achieved also by connecting the current detecting emitter SE and the sensing anode SA of the transistor Q1 to each other, as shown in (b) of FIG. 12. Therefore, since the terminal of the current detecting emitter SE and the terminal of the sensing anode SA of the transistor Q1 are connected to each other within the package, the number of output terminals for outputting outside of the package can be reduced smaller than that in the circuit structure of (a) of FIG. 12 while achieving the similar effects.

Ninth Embodiment

Figure 15:
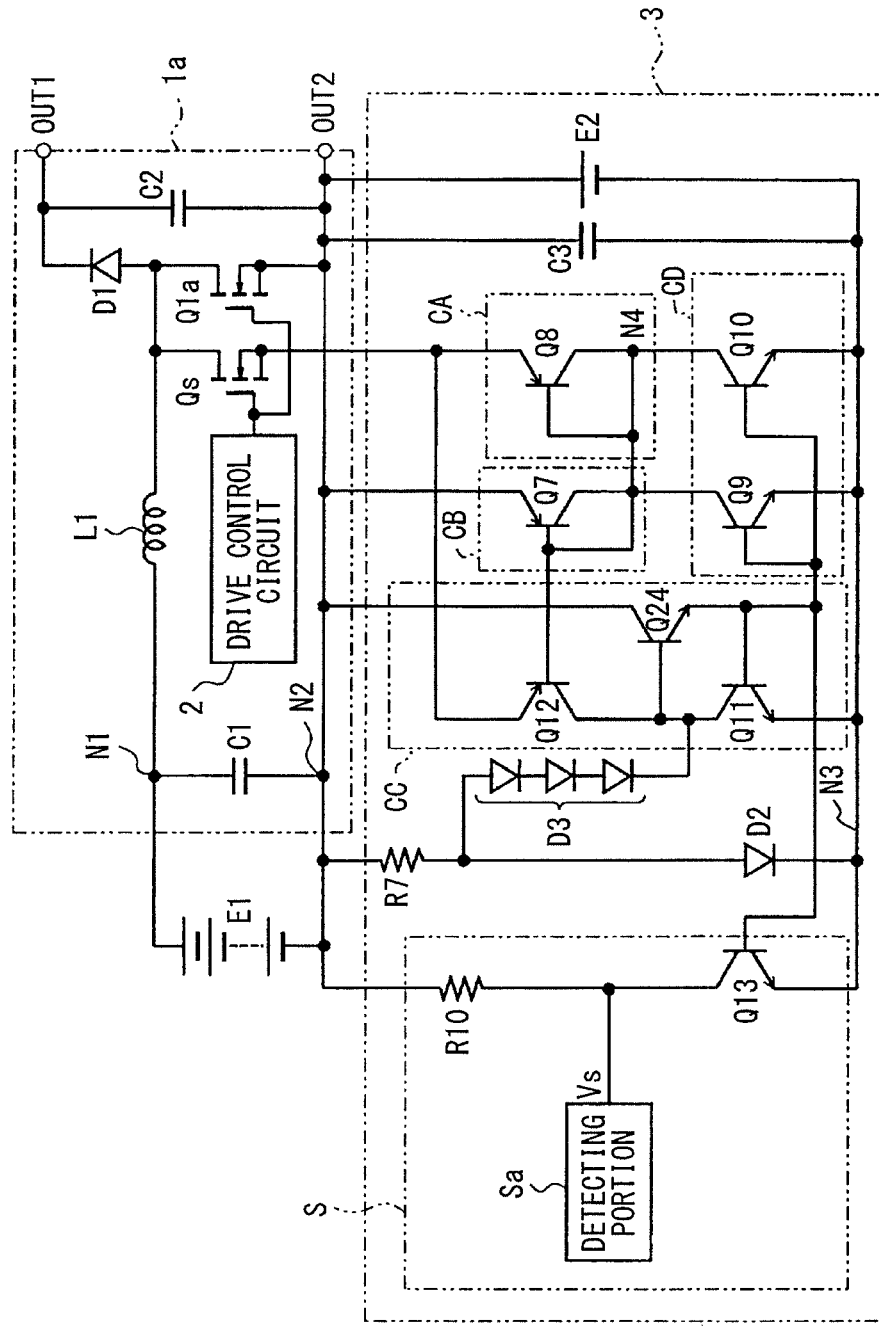
FIG. 15 is a diagram illustrating a circuit block of a power conversion circuit according to a ninth embodiment of the present disclosure.

FIG. 15 is a diagram illustrating a ninth embodiment of the present disclosure. A difference from the embodiments described above is that a current mirror circuit with a base current compensation circuit is used. Parts same as or similar to those of the embodiments described above will be designated with the same or similar reference numbers, and description thereof will be omitted. Hereinafter, differences will be explained.

In FIG. 15, a characteristic circuit of the present embodiment is added to the circuit structure of the third embodiment. In the current mirror circuit, because a current amplification factor βF of the transistor is infinite in an ideal consideration, the amount of base current of each of the transistors Q7 to Q12 can be ignored. However, in the actual transistors Q7 to Q12, it is necessary to apply the base current. Therefore, the mirror current amount of the current mirror circuit is slightly lower than an ideal current amount, resulting in an error factor of the current mirror circuit.

In the present embodiment, therefore, a transistor Q24 serving as the base current compensation circuit is provided. The transistor Q24, which serves as the base current compensation circuit, amplifies the collector current of the transistor Q11, and supplies the current as the base currents of the transistors Q9 to Q11 and Q13. With this, since the transistor Q24 can compensate that the current amplification factor βF of the transistor Q11 and the like is finite, accuracy of the current mirror circuit can be improved.

Tenth Embodiment

Figure 16:
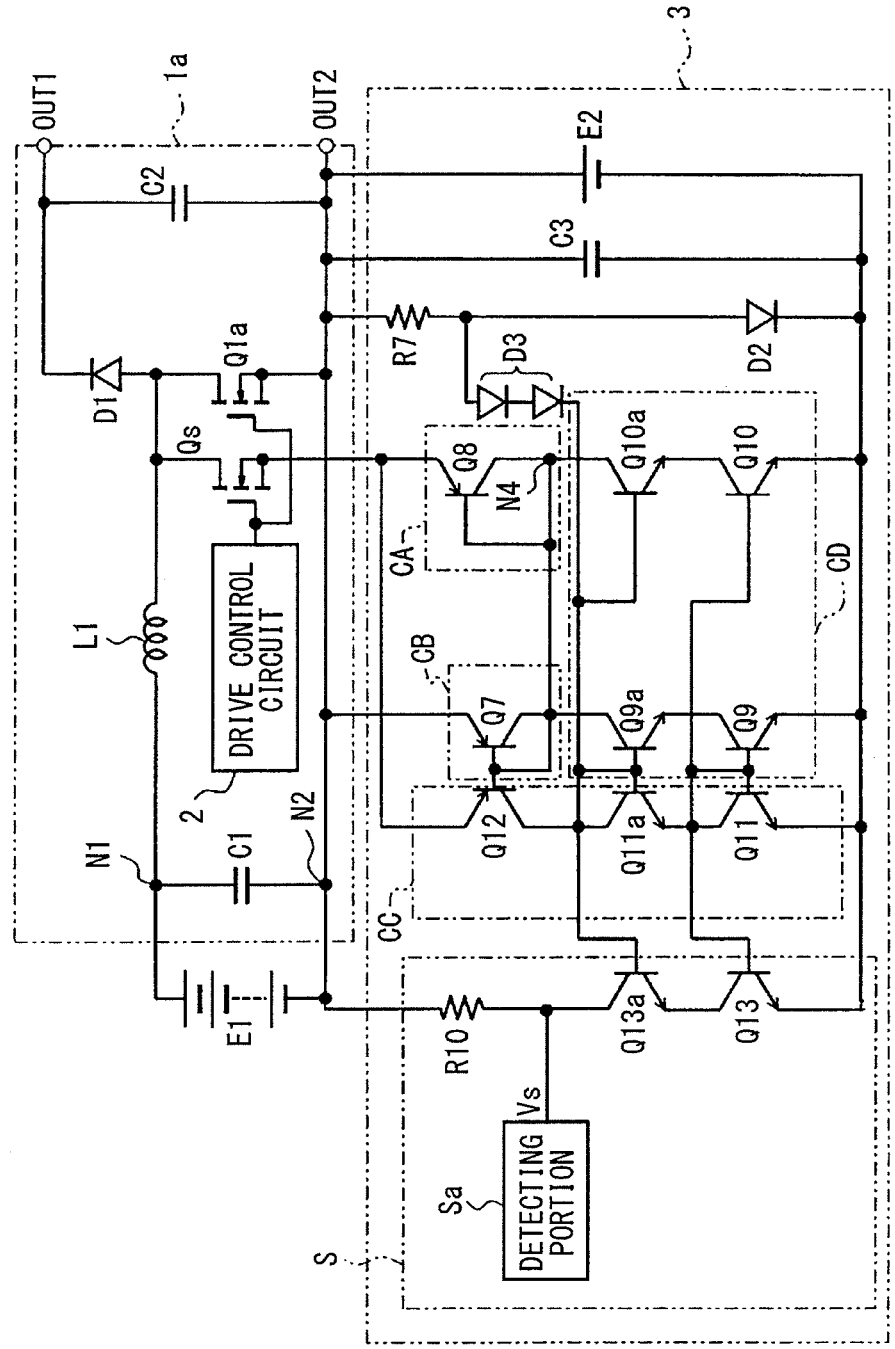
FIG. 16 is a diagram illustrating a circuit block of a power conversion circuit according to a tenth embodiment of the present disclosure.

FIG. 16 is a diagram illustrating a tenth embodiment of the present disclosure. A difference from the embodiments described above is that it is configured using a cascode current mirror circuit. Parts same as or similar to those of the embodiments described above will be designated with the same or similar reference numbers, and description thereof will be omitted. Hereinafter, differences will be explained.

FIG. 16 illustrates a circuit structure in which a characteristic circuit of the present embodiment is added to the circuit structure of the third embodiment. When a bipolar transistor is operated in an active region, if the collector-to-emitter voltage increases, the width of a depletion layer between a collector layer and a base layer expands and the width of the base layer shortens, generating the Early effect.

Therefore, as shown in FIG. 16, a cascode current mirror circuit (Q9a to Q11a, Q13a) may be employed according to the degree of the output voltage of the DC voltage generation circuit E2. The cascade current mirror circuit (Q9a to Q11a, Q13a) compensates that the resistance value of the collector-to-emitter of the transistors Q9 to Q11 and Q13 of the general current mirror circuit is finite. Therefore, the error of the current mirror circuit can be reduced, and thus the current detection error can be reduced.

Eleventh Embodiment

Figure 17:
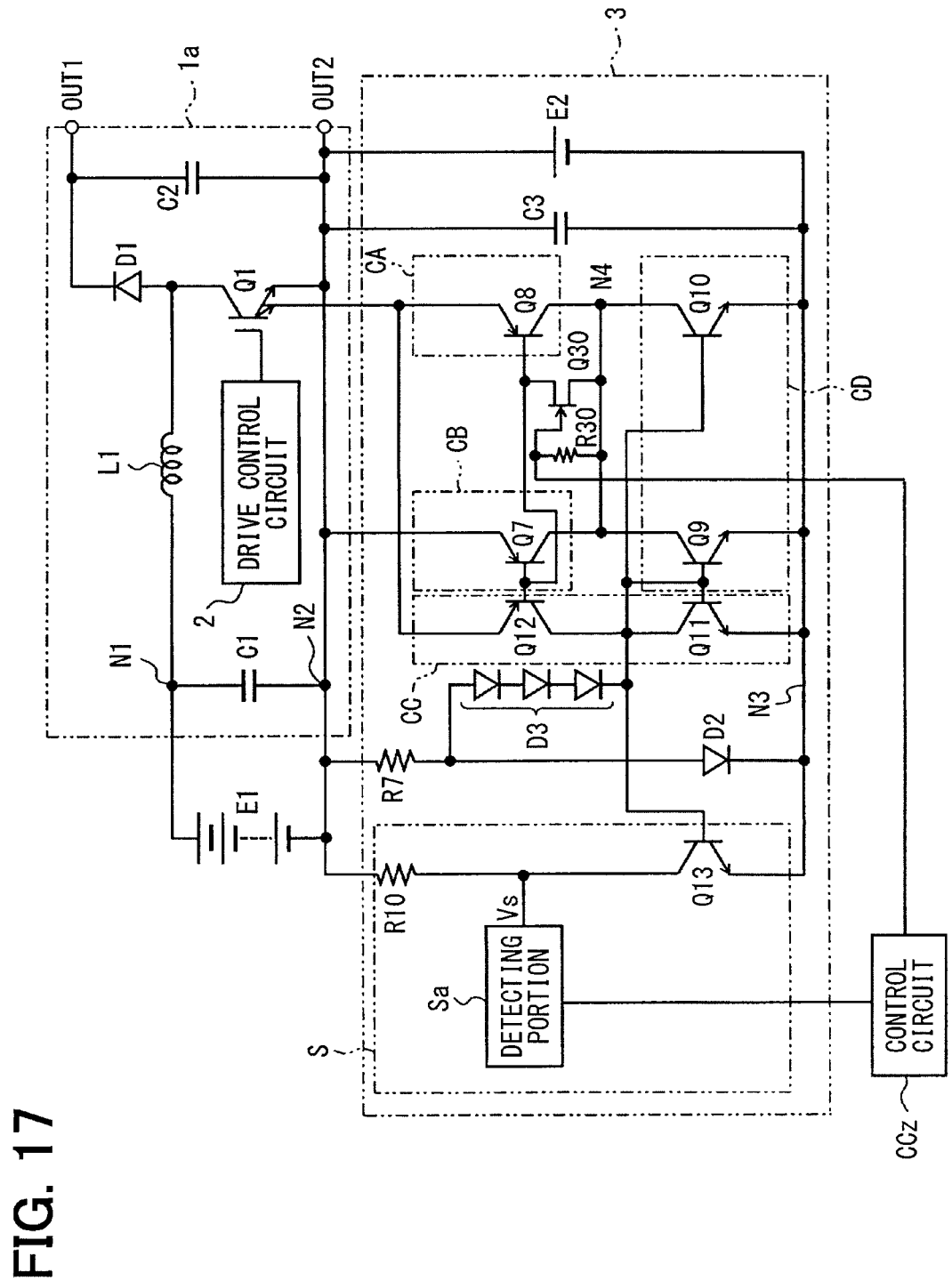
FIG. 17 is a diagram illustrating a circuit structure of a power conversion circuit according to an eleventh embodiment of the present disclosure.

FIG. 17 is a diagram illustrating an eleventh embodiment of the present disclosure. The difference from the embodiments described above is that the current detection circuit has a function of restricting an overcurrent from being conducted inside thereof. The same or similar parts to those of the embodiment described above will designated with the same or similar reference numbers, and descriptions thereof will be omitted. Hereinafter, the difference will be explained.

FIG. 17 employs a circuit in which a switch Q30 for restricting a flow of current is disposed on a conduction path from a node N4 to a base of a transistor Q8 in a characteristic circuit structure of the third embodiment. A resistor R30 is connected between a control terminal of the switch Q30 and a node N4. In FIG. 17 according to the present embodiment, the switch Q30 uses an N-channel JFET.

In a case where the switch Q30 is on, the other emitter of the transistor Q1 (the emitter of the transistor Qs of FIG. 2) is controlled to have substantially the same potential to the one emitter of the transistor Q1 (the emitter of the transistor Q1a of FIG. 2) by the circuit operation described in the embodiment described above. Therefore, the current proportional to the one emitter of the transistor Q1 is conducted to the other emitter of the transistor Q1.

However, there is a case where an excessive current transitionally flows in the one emitter (the emitter of the transistor Q1a) of the transistor Q1 due to a failure such as an instant short circuit of a reactor. When the current proportional to this excessive current passes through the current detection circuit 3 via the other emitter (the emitter of the transistor Qs), there is a possibility that the current detection circuit 3 is deteriorated due to the conduction of the excessive current.

The one emitter of the transistor Q1, which is used to conduct a large amount of current, has a high capacity to resist current. On the other hand, the current detection circuit 3, which is generally made of a small signal circuit, has a low capacity to resist current. Therefore, there is a possibility that the current detection circuit 3 is deteriorated by the current which the one emitter of the transistor Q (the emitter of the transistor Q1a) can bear.

Therefore, it is preferable to have a function of restricting the current conducted to the other emitter of the transistor Q1 (the emitter of the transistor Qs) for detecting the current when the current detection circuit 3 detects the excessive current as described above.

In the present embodiment, this function is realized in the following manner. A control circuit CCz is connected to the detecting portion Sa. The control circuit CCz controls the switch Q30 on, unless the detection current of the detecting portion Sa exceeds a predetermined current value, to continue a normal current detection operation. On the other hand, when the detection current of the detecting portion Sa exceeds the predetermined threshold, the control circuit CCz turns off the switch Q30 to reduce the current of the other emitter of the main transistor Q1 (the emitter of the transistor Qs). Alternatively, the current of the other emitter of the main transistor Q1 may be reduced by gradually increasing a base-to-collector resistance of the transistor Q8 by gradually increasing the on-state resistance according to a gradual change of a control signal of a control terminal of the switch Q30.

The reasons that the current of the other emitter of the transistor Q1 can be reduced by turning off the switch Q30 are as follows.

Namely, when the switch Q30 is turned off, the resistance of the circuit CB and the resistance of the circuit CA increase, and the voltage drop due to the current being conducted to these elements increases. Therefore, although the potential of the node N4 is largely reduced, since the power source voltage of the power source voltage generation circuit E2 is finite, the potential of the node N4 cannot be made equal to or less than the potential of a negative electrode of the power source voltage generation circuit E2.

Therefore, a circuit operation of making the potential of the one emitter of the transistor Q1 (the emitter of the transistor Q1a) and the potential of the other emitter of the transistor Q1 (the emitter of the transistor Qs) equal to each other cannot be maintained, and thus the potential of the other emitter increases. As a result, the current flowing in from the other emitter (the emitter of the transistor Qs) can be reduced. It is to be noted that the control circuit CCz may have a function of performing feedback control of the potential of the control electrode of the switch Q30 so as to avoid the detection current value from increasing equal to or greater than the predetermined value.

Other Embodiments

The present disclosure may not be limited to the embodiments described above, but may be modified or expanded, for example, as follows.

Each of the circuit elements explained in the above-described embodiments (for example, active elements such as transistor and diode, passive elements such as resistor and reactor, and mechanism elements such as electric wire and fuse) is not limited to the circuit element of the type indicated in the above-described embodiments. In the above-described embodiments, although the transistor typically uses the bipolar transistor, it may not be limited to the bipolar transistor. The transistor may use a MOSFET or the like.

In the above-described embodiments, the circuit having both of the first current conducting element and the second current conducting element is employed for the purpose of detecting the current without generating loss of the large current flowing in the first current conducting element. Alternatively, it may be configured as a current detection circuit that has the second current conducting element only without having the first current conducting element, and detects a small amount of current flowing in the second current conduction element, for the purpose of detecting the small current, which does not matter the generation of loss.

Figure 18:
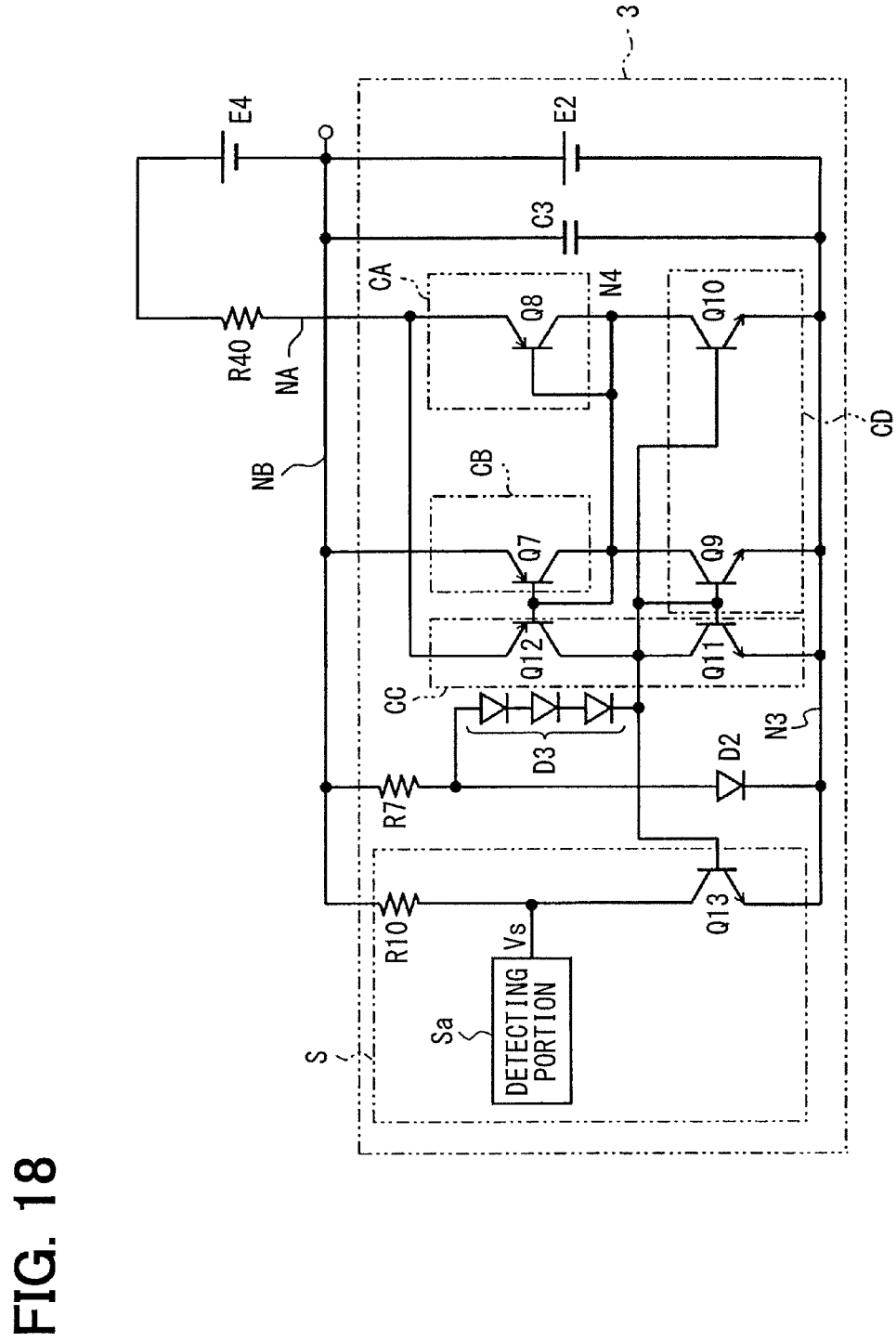
FIG. 18 is a diagram illustrating a circuit structure of a power conversion circuit according to another embodiment of the present disclosure.
Figure 19:
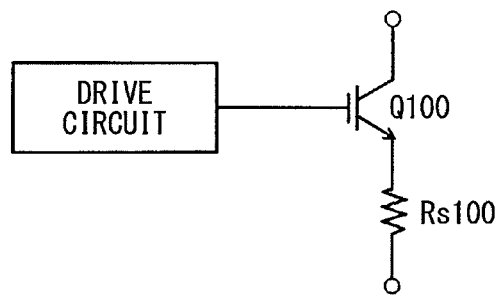
FIG. 19 is an explanatory diagram of a prior art.
Figure 20:
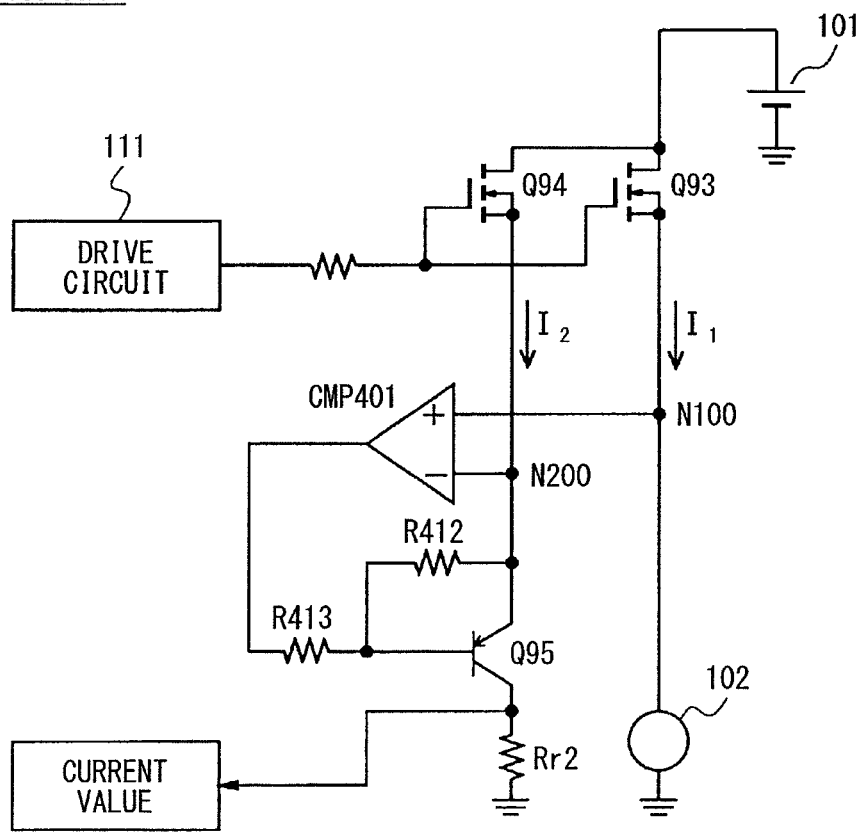
FIG. 20 is an explanatory diagram of a prior art.
Figure 21:
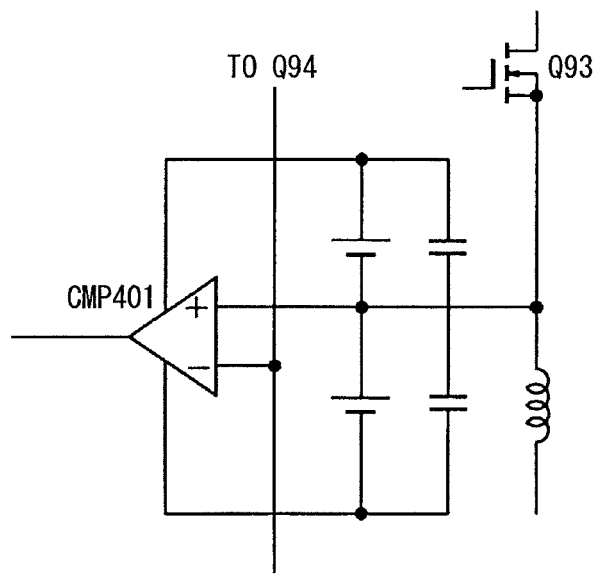
FIG. 21 is an explanatory diagram of a related art.
Figure 22:
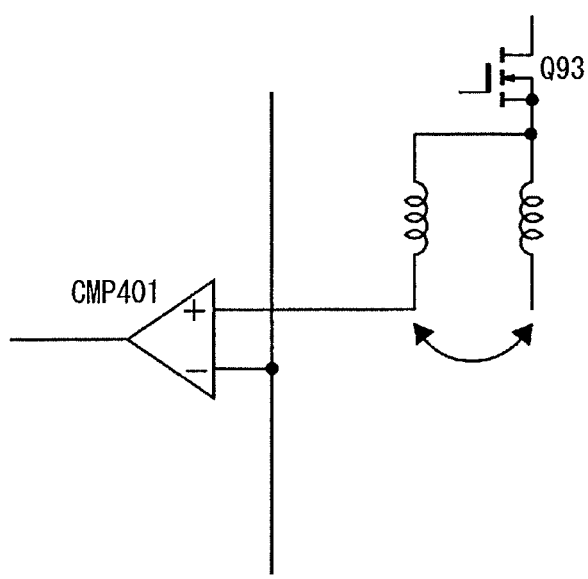
FIG. 22 is an explanatory diagram of a related art.
Figure 23:
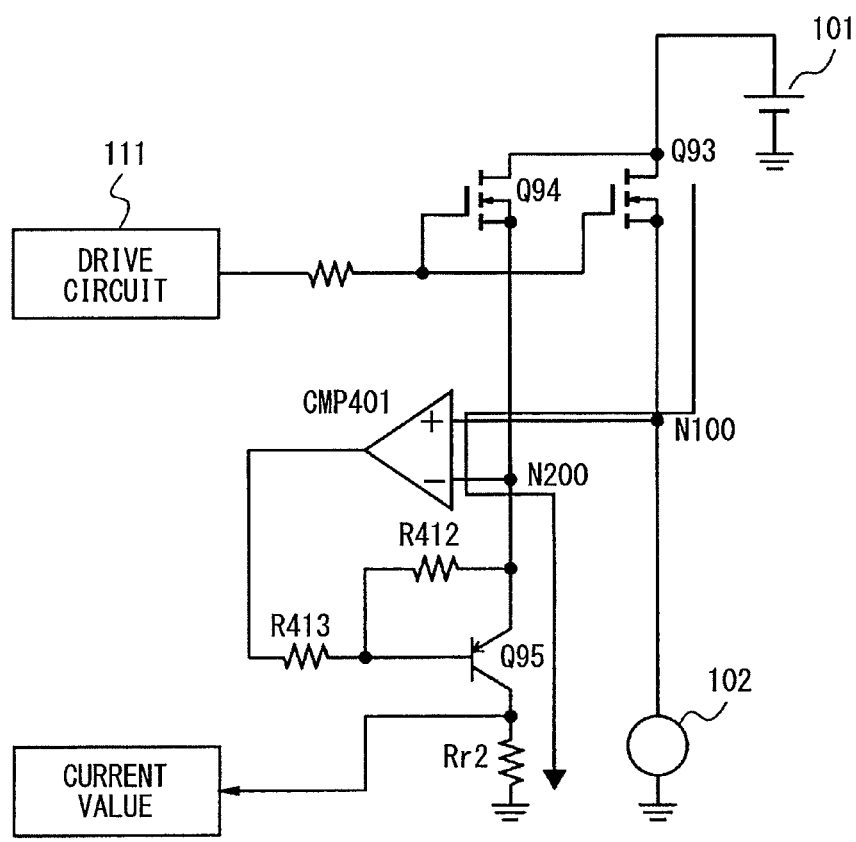
FIG. 23 is an explanatory diagram of a related art.

For example, although a structure of FIG. 18 has a circuit structure based on FIG. 5 of the third embodiment, a resistor R40 is connected between a positive terminal of a voltage generation circuit E4 and an emitter of a transistor Q8. The resistor R40 corresponds to a second current conducting element, and that the structure of FIG. 18 corresponds to the structure that does not have the first current conducting element in FIG. 5. In this structure, a current flowing in the second current conducting element (resistor R40) via a node NA can be measured.

For example, when the voltage generation circuit E4 applies a voltage between a node NB and the node NA, a current can be conducted to the second conducting element (resistor R40). However, the node NA is maintained to have the same potential as the node NB. Therefore, a current value of the case where the voltage is virtually applied to both the ends of the second current conducting element (resistor R40) can be measured. In any of the above-mentioned embodiments, the current detection circuit may be configured for the purpose of detecting the small current in the similar manner.

Also in the detection circuit for the small current, if a circuit that switches a large current is disposed adjacent to the detection circuit for the small current, there is a possibility that the detection circuit is broken due to an induced current or an induced voltage. Also in such the use, the deterioration of the current detection circuit 3 can be reduced by employing the current detection circuit 3 as the present embodiment.

In addition to the current mirror circuits shown in FIG. 15 of the ninth embodiment and in FIG. 16 of the tenth embodiment, a Wilson current mirror circuit, a cascode bootstrap Wilson mirror circuit, an emitter resistance-added current mirror, and the like may be employed.

The start-up circuits (R7, D2, D3) are examples. Other structures may be employed as long as they constitute a circuit that applies a starting current for starting a bias circuit when the current detecting transistor Qs shifts from an off state to an on state. The start-up circuits are provided by the structure where the DC voltage generation circuit E2, E2b is included in the current detection circuit 3, 3b. However, the start-up circuit may be made externally or in any way.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

While the present disclosure has been described with reference to embodiments thereof, it is to be understood that the present disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A current detection circuit comprising:
a first circuit having at least two terminals including a first terminal and a second terminal, the second terminal defining a voltage reference node, and a first current flowing between the first terminal and the second terminal; and
a second circuit having at least two terminals including a third terminal and a fourth terminal, the fourth terminal defining a voltage reference node and being commonly connected to the second terminal of the first circuit, wherein when the first circuit has a voltage drop same as a voltage drop of the second circuit, the first current flowing between the first terminal and the second terminal of the first circuit has an amount proportional to an amount of a second current flowing between the third terminal and the fourth terminal of the second circuit;
a current control circuit controlling the first current conducted to the first circuit so that an application voltage between the first terminal and the second terminal of the first circuit is substantially same as an application voltage between the third terminal and the fourth terminal of the second circuit, according to the amount of the second current of the second circuit; and
a detection circuit detecting the first current of the first circuit or the second current of the second circuit,
wherein a current flowing between the first terminal and the third terminal is detected.

2. The current detection circuit according to claim 1, further comprising:
a first current conducting element conducting a current through a terminal; and
a second current conducting element for current detection, the second current conducting element having a terminal that has a function same as a function of the terminal of the first current conducting element, in which a conduction current of the terminal of the second current conducting element flows in accordance with a conduction current of the first current conducting element,
wherein the first terminal is connected to the terminal of the first current conducting element, and the third terminal is connected to the terminal of the second current conducting element.

3. The current detection circuit according to claim 2, wherein
the first current conducting element has a first main electrode, a second main electrode, and a control electrode, and has an opening and closing function of opening and closing a flow path of the conduction current of the terminal through the first main electrode and the second main electrode according to an application signal applied to the control electrode, and
the second current conducting element has a first main electrode, a second main electrode and a control electrode each having a function same as a function of corresponding one of the first main electrode, the second main electrode and the control electrode of the first current conducting element, the control electrode of the first current conducting element and the control electrode of the second current conducting element are commonly connected, and the first main electrode of the first current conducting element and the first main electrode of the second current conducting element are commonly connected.

4. The current detection circuit according to claim 1, wherein
the current control circuit detects a current or a voltage of the second circuit, and is realized by a function of drawing or supplying the sum of currents flowing in the second circuit and the first circuit from or to the voltage reference node, when the first circuit is applied with a voltage equal to the voltage drop of the second circuit.

5. The current detection circuit according to claim 2, wherein
each of the first current conducting element and the second current conducting element includes a diode, and one of anodes and cathodes of the first current conducting element and the second current conducting element are connected to each other.

6. The current detection circuit according to claim 1, wherein
the first circuit and the second circuit both use resistors, and the second current of the second circuit is detected according to a voltage generated in the resistor of the second circuit.

7. The current detection circuit according to claim 1, wherein
the first circuit and the second circuit both use diodes or diode-connected transistors, and the current of the second circuit is detected according to the voltage drop of the second circuit.

8. The current detection circuit according to claim 1, wherein
the current control circuit has a current control function that employs a conduction current of the second circuit as an input current, and controls an output current provided by mirroring the input current at a fixed ratio as an output current to be conducted to the first circuit.

9. The current detection circuit according to claim 8, wherein
the current control function makes the output current of the first circuit smaller than the input current of the second circuit by setting a mirror ratio of the output current relative to the input current less than one.

10. The current detection circuit according to claim 8, wherein
the current control circuit includes:

a first current mirror circuit that employs the conduction current of the second circuit as an input current, and obtains an output current by mirroring the input current; and a second current mirror circuit that employs the output current obtained by the first current mirror circuit as an input current, and makes the application voltage between the first terminal and the second terminal of the first circuit substantially same as the application voltage between the third terminal and the fourth terminal of the second circuit by controlling an output current provided by mirroring the input current as the output current to be conducted to the first circuit.

11. The current detection circuit according to claim 10, wherein the output current of the first current mirror circuit is supplied from the second current conducting element, and the output current mirrored is made greater than the input current of the second circuit by setting a mirror ratio of the output current relative to the input current greater than one.

12. The current detection circuit according to claim 10, wherein the output current of the second current mirror circuit is supplied from the second current conducting element, and the output current to be conducted to the first circuit is made smaller than the output current of the second current mirror circuit by setting a mirror ratio of the output current to the input current smaller than one.

13. The current detection circuit according to claim 1, further comprising:

a third current mirror circuit that employs one of a conduction current of the second circuit, a conduction current of a current path on which a current proportional to the conduction current of the second circuit flows, and an output current of the first circuit controlled by the current control circuit, as an input circuit, and obtains an output current by mirroring the input current, wherein the detection circuit detects the current according to detection of the output current of the third current mirror circuit.

14. The current detection circuit according to claim 13, wherein in the third current mirror circuit, a mirror ratio of the output current relative to the input current is set smaller than one.

15. The current detection circuit according to claim 13, further comprising:

a switching element switching the mirror ratio of the output current to the input current of the third current mirror circuit.

16. The current detection circuit according to claim 1, further comprising:

a current restriction function of detecting a circuit current within the detection circuit and restricting the second current when the circuit current exceeds a predetermined current value.

17. A semiconductor integrated circuit device comprising:

at least the first circuit, the second circuit, and the current control circuit of the current detection circuit according to claim 1, wherein the first circuit, the second circuit and the current control circuit are integrated on a same semiconductor substrate by combining semiconductor elements, as a semiconductor integrated circuit.

18. A semiconductor integrated circuit device comprising:

a drive control circuit controlling conduction of the first current conducting element and the second current conducting element of the current detection circuit according to claim 2; and at least the first circuit, the second circuit and the current control circuit of the current detection circuit according to claim 2, wherein the first circuit, the second circuit, the current control circuit and the drive control circuit are integrated on a same semiconductor substrate by combining semiconductor circuit elements, as a semiconductor integrated circuit.

* * * * *